(12) United States Patent
Landig et al.

(10) Patent No.: US 11,045,835 B1
(45) Date of Patent: Jun. 29, 2021

(54) NANOVOIDED POLYMERS USING PHASE INVERSION

(71) Applicant: Facebook Technologies, LLC, Menlo Park, CA (US)

(72) Inventors: Renate Eva Klementine Landig, Seattle, WA (US); Kenneth Diest, Kirkland, WA (US); Sheng Ye, Redmond, WA (US); Andrew John Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 58 days.

(21) Appl. No.: 16/449,964

(22) Filed: Jun. 24, 2019

Related U.S. Application Data

(60) Provisional application No. 62/777,825, filed on Dec. 11, 2018.

(51) Int. Cl.
  *B05D 3/00* (2006.01)
  *B05D 3/06* (2006.01)
  *B05D 3/10* (2006.01)
  *H01L 41/047* (2006.01)

(52) U.S. Cl.
  CPC ............ *B05D 3/067* (2013.01); *B05D 3/101* (2013.01); *B05D 3/108* (2013.01); *H01L 41/047* (2013.01); *B05D 2201/02* (2013.01); *B05D 2350/30* (2013.01); *B05D 2400/00* (2013.01); *B05D 2502/00* (2013.01); *B05D 2503/00* (2013.01); *B05D 2504/00* (2013.01); *B05D 2505/00* (2013.01); *B05D 2518/12* (2013.01)

(58) Field of Classification Search
  CPC ........ B05D 3/101; B05D 3/108; B05D 3/067; H01L 41/047
  See application file for complete search history.

(56) References Cited

U.S. PATENT DOCUMENTS

| | | |
|---|---|---|
| 5,095,515 A | 3/1992 | Seaver |
| 6,420,441 B1 | 7/2002 | Allen et al. |
| 6,628,850 B1 | 9/2003 | Yao |
| 7,230,771 B2 | 6/2007 | Kuiper et al. |
| 8,477,402 B2 | 7/2013 | Duncan et al. |
| 8,848,280 B2 | 9/2014 | Arsenault |

(Continued)

OTHER PUBLICATIONS

"Understanding and guiding the phase inversion process for synthesis of solvent resistant nanofiltration membranes", Agnieszka K. Hołda, Ivo F.J. Vankelecom, J. Appl. Polym. Sci. 42130, (Year: 2015).*

(Continued)

*Primary Examiner* — David P Turocy
*Assistant Examiner* — Mohammad Mayy
(74) *Attorney, Agent, or Firm* — FisherBroyles, LLP

(57) ABSTRACT

Example methods include depositing a precursor layer onto a substrate where the precursor layer includes droplets comprising a polymerizable material, inducing a phase inversion in the precursor layer to obtain a modified precursor layer including droplets of a non-polymerizable liquid within a polymerizable liquid mixture, and polymerizing the polymerizable liquid mixture to obtain a nanovoided polymer element. Examples include devices fabricated using nanovoided polymer elements fabricated using such methods, including electroactive devices such as actuators and sensors.

19 Claims, 16 Drawing Sheets

(56) References Cited

U.S. PATENT DOCUMENTS

| | | | |
|---|---|---|---|
| 9,228,822 | B2 | 1/2016 | Majidi et al. |
| 10,670,782 | B2 | 6/2020 | Arbabi et al. |
| 10,690,946 | B2 | 6/2020 | Wilson |
| 10,749,448 | B2 | 8/2020 | Lindsay et al. |
| 2002/0009251 | A1 | 1/2002 | Byrne |
| 2002/0135863 | A1 | 9/2002 | Fukshima et al. |
| 2002/0186928 | A1 | 12/2002 | Curtis |
| 2005/0196552 | A1 | 9/2005 | Lehmann et al. |
| 2006/0024976 | A1 | 2/2006 | Waldfried et al. |
| 2006/0028734 | A1 | 2/2006 | Kuiper et al. |
| 2007/0020404 | A1 | 1/2007 | Seiberle et al. |
| 2007/0263963 | A1 | 11/2007 | Hughes et al. |
| 2008/0137031 | A1 | 6/2008 | Hillis et al. |
| 2008/0171431 | A1 | 7/2008 | Yu et al. |
| 2008/0197518 | A1 | 8/2008 | Aylward et al. |
| 2008/0224103 | A1 | 9/2008 | Arsenault et al. |
| 2009/0034051 | A1 | 2/2009 | Arsenault et al. |
| 2009/0296188 | A1 | 12/2009 | Jain et al. |
| 2010/0075056 | A1 | 3/2010 | Axisa et al. |
| 2011/0149410 | A1 | 6/2011 | Blum |
| 2011/0242638 | A1 | 10/2011 | Horning et al. |
| 2012/0019185 | A1 | 1/2012 | Guidarelli et al. |
| 2012/0029416 | A1 | 2/2012 | Parker et al. |
| 2012/0200931 | A1 | 8/2012 | Haag et al. |
| 2012/0298200 | A1 | 11/2012 | Niggemann et al. |
| 2013/0202867 | A1 | 8/2013 | Coggio et al. |
| 2013/0222881 | A1 | 8/2013 | Aizenberg et al. |
| 2013/0279151 | A1 | 10/2013 | Ouderkirk et al. |
| 2013/0335807 | A1 | 12/2013 | Arsenault et al. |
| 2014/0133010 | A1 | 5/2014 | Han et al. |
| 2014/0204372 | A1 | 7/2014 | Pang et al. |
| 2014/0217539 | A1 | 8/2014 | Rantala |
| 2014/0234995 | A1 | 8/2014 | Li et al. |
| 2014/0266647 | A1 | 9/2014 | Visitacion et al. |
| 2015/0109657 | A1 | 4/2015 | Baumberg et al. |
| 2015/0205126 | A1 | 7/2015 | Schowengerdt |
| 2015/0241698 | A1 | 8/2015 | Schowengerdt |
| 2015/0315012 | A1 | 11/2015 | Wiersma et al. |
| 2016/0103341 | A1 | 4/2016 | Long et al. |
| 2016/0187985 | A1 | 6/2016 | Lim et al. |
| 2016/0283773 | A1 | 9/2016 | Popovich et al. |
| 2017/0023807 | A1 | 1/2017 | Chang-Hasnain et al. |
| 2017/0031078 | A1 | 2/2017 | Thompson et al. |
| 2017/0090570 | A1 | 3/2017 | Rain et al. |
| 2017/0192595 | A1 | 7/2017 | Choi et al. |
| 2017/0285348 | A1 | 10/2017 | Ayres et al. |
| 2017/0365630 | A1 | 12/2017 | Yang |
| 2018/0093456 | A1 | 4/2018 | Van Overmeere et al. |
| 2018/0164627 | A1 | 6/2018 | Oh |
| 2018/0356303 | A1 | 12/2018 | Li et al. |
| 2019/0296218 | A1 | 9/2019 | Ouderkirk et al. |
| 2019/0361318 | A1 | 11/2019 | Johnson et al. |
| 2020/0076328 | A1 | 3/2020 | Cha et al. |
| 2020/0183168 | A1 | 6/2020 | Spann et al. |
| 2020/0183199 | A1 | 6/2020 | Diest et al. |
| 2020/0183200 | A1 | 6/2020 | Diest et al. |
| 2020/0185590 | A1 | 6/2020 | Malhotra et al. |

OTHER PUBLICATIONS

"Synthesis of solvent stable polymeric membranes via UV depth-curing", Izabela Struzynska-Piron, Johan Loccufier, Luc Vanmaele and Ivo F. J. Vankelecom,Chem. Commun., 49, 11494, (Year: 2013).*

Zhu et al., "Large deformation and electromechanical instability of a dielectric elastomer tube actuator", Journal of Applied Physics, vol. 108, Issue 7, Article 074113, Oct. 13, 2010, pp. 1-6.

Non-Final Office Action received for U.S. Appl. No. 16/351,477 dated Jun. 23, 2020, 27 pages.

Catmull et al., "Recursively generated B-spline surfaces on arbitrary topological meshes", Computer-Aided Design, vol. 10, No. 6, Nov. 1, 1978, pp. 183-188.

Loop, Charles Teorell, "Smooth Subdivision Surfaces Based on Triangles", Thesis, Master of Science, University of Utah, Aug. 1, 1987, 74 pages.

Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.

Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 39 pages.

Cruz-Hernandez et al., "Phase Control Approach to Hysteresis Reduction", IEEE Transactions on Control Systems Technology, vol. 9, No. 1, Jan. 1, 2001, pp. 17-26.

Zuev, Yu.S., "Elastomer-gas systems", International Polymer Science and Technology, vol. 28, No. 2, Feb. 1, 2001, pp. 43-53.

Shir, Daniel Jay-Lee et, "Three-Dimensional Nanofabrication with Elastomeric Phase Masks", PhD Thesis, University of Illinois at Urbana-Champaign, Oct. 17, 2007, 138 pages.

Non-Final Office Action received for U.S. Appl. No. 16/364,977 dated Oct. 19, 2020, 38 pages.

Moore, Duncan T., "Gradient Index Optics", Optical Elements, IVPV Handbook of Optics, 2nd Edition, vol. II—Devices, Measurements, and Properties, 1995, pp. 9.1-9.10.

Nguyen et al., "Synthesis, Processing, and Characterization of Inorganic-Organic Hybrid Cross-Linked Silica, Organic Polyimide, and Inorganic Aluminosilicate Aerogels", National Aeronautics and Space Administration STI Program, NASA/CR-2014-218328, Jul. 2014, 58 pages.

Shatz, Narkis, "Gradient-Index Optics", Science Applications International Corp., Final Report, Mar. 31, 2010, 103 pages.

Teichman et al., "Gradient Index Optics at DARPA", Institute for Defense Analyses, IDA Document D-5027, Nov. 2013, 69 pages.

Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.

Fuse et al., "Possible Mechanism of Superior Partial-Discharge Resistance of Polyamide Nanocomposites", Annual Report Conference on Electrical Insulation and Dielectric Phenomena, 2004, pp. 322-325.

Johnson et al., "A brief review of atomic layer deposition:from fundamentals to applications", Materials Today, vol. 17, No. 5, Jun. 2014, pp. 236-246.

Camino et al., "Polydimethylsiloxane thermal degradation Part 1. Kinetic aspects", Polymer, vol. 42, 2001, pp. 2395-2402.

Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.

Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.

Waldem et al., "Digilens Switchable Bragg grating waveguide optics for augmented reality applications", Proc. SPIE 10676, Digital optics for Immersive Displays, May 21, 2018, 1 page.

Diest et al., "Nanovoided Tunable Optics", U.S. Appl. No. 16/262,439, filed Jan. 30, 2019, 57 pages.

Ouderkirk et al., "Nanovoided Graded-Index Optical Elements, Optical Arrays, and Methods of Forming the Same", U.S. Appl. No. 16/426,737, filed May 30, 2019, 113 pages.

Diest et al., "Polymer Materials Including Coated Nanovoids and Methods and Systems for Forming the Same", U.S. Appl. No. 16/512,335, filed Jul. 15, 2019, 133 pages.

Sharma et al., "Switchable Electroactive Devices for Head-Mounted Displays", U.S. Appl. No. 16/351,477, filed Mar. 12, 2019, 108 pages.

Spann et al., "Nanovoided Polymers Having Shaped Voids", U.S. Appl. No. 16/703,674, filed Dec. 4, 2019, 149 pages.

Landig et al., "Planarization Layers for Nanovoided Polymers", U.S. Appl. No. 16/364,977, filed Mar. 26, 2019, 125 pages.

Ouderkirk et al., "Waveguide with Switchable Input", U.S. Appl. No. 16/263,829, filed Jan. 31, 2019, 55 pages.

(56) References Cited

OTHER PUBLICATIONS

Landig et al., "Multiple Layers Between Electrodes Including Nanovoided Polymer", U.S. Appl. No. 16/386,232, filed Apr. 16, 2019, 126 pages.

Spann et al., "Reduced Hysteresis and Reduced Creep in Nanovoided Polymer Devices", U.S. Appl. No. 16/703,291, filed Dec. 4, 2019, 152 pages.

Diest et al., "Nanovoided Tunable Birefringence", U.S. Appl. No. 16/262,433, filed Jan. 30, 2019, 51 pages.

Malhotra et al., "Spatially Addressable Nanovoided Polymers", U.S. Appl. No. 16/417,911, filed May 21, 2019, 138 pages.

Landig et al., "Fabrication of Shaped Voids", U.S. Appl. No. 16/669,970, filed Oct. 31, 2019, 110 pages.

International Search Report and Written Opinion received for PCT Application Serial No. PCT/US2019/064395 dated Mar. 12, 2020, 17 pages.

Si et al., "Liquid-Crystal-Enabled Active Plasmonics: A Review", Materials, vol. 7, No. 2, Feb. 18, 2014, pp. 1296-1317.

Crawford, Gregory P., "Electrically Switchable Bragg Gratings", Optics & Photonics News, Apr. 30, 2003, pp. 54-59.

Dickson et al., "Electronically Controlled Surface Plasmon Dispersion and Optical Transmission through Metallic Hole Arrays Using Liquid Crystal", Nano Letters, vol. 8, No. 1, Jan. 1, 2008, pp. 281-286.

International Search Report and Written Opinion received for PCT Application Serial No. PCT/US2019/064367 dated Mar. 11, 2020, 17 pages.

Mullin et al., "Pattern Transformation Triggered by Deformation", Physical Review Letters, vol. 99, No. 8, 084301, Aug. 22, 2007, 4 pages.

Babaee et al., "3D Soft Metamaterials with Negative Poisson's Ratio", Advanced Materials, vol. 25, No. 36, Jul. 22, 2013, pp. 5044-5049.

Bertoldi et al., "Negative Poisson's Ratio Behavior Induced by an Elastic Instability", Advanced Materials, vol. 22, No. 3, Jan. 13, 2010, pp. 361-366.

Overvelde et al., "Relating pore shape to the non-linear response of periodic elastomeric structures", Journal of the Mechanics and Physics of Solids, vol. 64, Mar. 2014, pp. 351-366.

Ren et al., "Design and characterisation of a tuneable 3D buckling-induced auxetic metamaterial", Materials & Design, vol. 139, Feb. 5, 2018, pp. 336-342.

Correa et al., "Negative stiffness honeycombs for reoverable shock isolation", Rapid Prototyping Journal, vol. 21, No. 2, Mar. 16, 2015, pp. 193-200.

Coulais et al., "Discontinuous Buckling of Wide Beams and Metabeams", Physical Review Letters, vol. 115, No. 4, Jul. 21, 2015, 7 pages.

Bickel et al., "Design and Fabrication of Materials with Desired Deformation Behavior", ACM Transactions on Graphics, vol. 29, No. 4, Article 63, Jul. 1, 2010, pp. 1-10.

Rosset et al., "Small, fast, and tough: Shrinking down integrated elastomer transducers", Applied Physics Review, vol. 3, No. 3, Article 031105, Sep. 26, 2016, pp. 1-20.

Plante et al., "Large scale failure modes of dielectric elastomer actuators", International Journal of Solids and Structures, vol. 43, Mar. 29, 2006, pp. 7727-7751.

Optotune, "Electroactive Polymers", URL: https://optotune.com/technology/electroactive-polymers, retrieved on Apr. 30, 2020, 3 pages.

Novasentis, "Haptic Actuators", URL: https://novasentis.com/product, retrieved on Apr. 30, 2020, 4 pages.

Rosset et al., "Mechanical characterization of a dielectric elastomer microactuator with ion-implanted electrodes", Sensors and Actuators, A, vol. 144, No. 1, Jan. 14, 2008, pp. 185-193.

Gerratt et al., "Dielectric breakdown of PDMS thin films", Journal of Micromech and Microengineering, Technical Note, vol. 23, No. 6, Article 067001, Apr. 26, 2013, pp. 1-7.

Hunt et al., "A self-healing dielectric elastomer actuator", Applied Physics Letters, vol. 104, Article 113701, Mar. 19, 2014, pp. 1-3.

Skov et al., "Optimization Techniques for Improving the Performance of Silicone-Based Dielectric Elastomers", Advances Engineering Materials, vol. 20, No. 5, Article 1700762, Nov. 27, 2017, pp. 1-21.

Mazurek et al., "Glycerol as high-permittivity liquid filler in dielectric silicone elastomer", Journal of Applied Polymer Science, vol. 133, No. 43, Article 44153, Jul. 20, 2016, pp. 1-8.

Rao et al., "Synthesis of flexible silica aerogels using methyltrimethoxysilane (MTMS) precursor", Journal of Colloid and Interface Science, vol. 300, No. 1, Aug. 1, 2006, pp. 279-285.

Seo et al., "Reticulated Nanoporous Polymers by Controlled Polymerization-Induced Microphase Separation", Science, vol. 336, Jun. 15, 2012, pp. 1422-1425.

Jennings, S.G., "The Mean Free Path in Air", J. Aerosol Sci., vol. 19, No. 2, Apr. 2, 1988, pp. 159-166.

Gupta et al., "Nanoemulsions: Formation, Properties, and Applications", Soft Matter, vol. 12, No. 11, Feb. 23, 2016, pp. 1-17.

Helgeson et al., "Mesoporous organohydrogels from thermogelling photocrosslinkable nanoemulsions", Nature Materials, vol. 11, Feb. 12, 2012, pp. 1-9.

Guha et al., "Creating nanoscale emulsions using condensation", Nature Communications, vol. 8, Article 1371, Nov. 8, 2017, pp. 1-7.

Meier et al., "Microemulsion elastomers", Colloid and Polymer Science, vol. 274, Mar. 1, 1996, pp. 218-226.

Richter et al., "Design considerations of form birefringent microstructures", Applied Optics, vol. 34, No. 14, May 10, 1995, pp. 2421-2429.

Mahadik et al., "Elastic and Superhydrophobic Monolithic Methyltrimethoxysilane-based Silica Aerogels by Two-step Sol-gel Process", J. Microelectron. and Packaging Soc., vol. 23, No. 1, Mar. 30, 2016, pp. 35-39.

Jeon et al., "Three dimensional nanoporous density graded materials formed by optical exposures through conformable phase masks", Applied Physics Letters, vol. 89, Article 253101, Dec. 18, 2006, pp. 1-3.

Sultan et al., "Electrical Breakdown Testing of Materials Intended for use in PV Modules", 3rd Atlas/NIST Workshop on Photovoltaics, Dec. 8-9, 2015, 29 pages.

Sekitani et al., "Stretchable active-matrix organic light-emitting diode display using printable elastic conductors", Nature Materials, vol. 8, May 10, 2009, pp. 494-499.

Someya et al., "Conformable, flexible, large-area networks of pressure and thermal sensors with organic transistor active matrixes", PNAS, vol. 102, No. 35, Aug. 30, 2005, pp. 12321-12325.

Wegener et al., "Controlled inflation of voids in cellular polymer ferroelectrets: Optimizing electromechanical transducer properties", Applies Physics Letters, vol. 84, No. 3, Jan. 19, 2004, pp. 392-394.

Wu et al., "Fabrication of ultralong perovskite structure nanotubes", RSC Advances, vol. 8, Jan. 2, 2018, pp. 367-373.

Wu et al., "Efficient multi-barrier thin film encapsulation of OLED using alternating Al2O3 and polymer layers", RSC Advances, vol. 8, Feb. 2, 2018, pp. 5721-5727.

Yang et al., "Harnessing Surface Wrinkle Patterns in Soft Matter", Advanced Functional Materials, vol. 20, Jul. 29, 2010, pp. 2550-2564.

Zhang et al., "Highly Porous Polyhedral Silsesquioxane Polymers. Synthesis and Characterization", J. Am. Chem. Soc., vol. 120, Aug. 11, 1998, pp. 8380-8391.

Yang et al., "Avoiding the pull-in instability of a dielectric elastomer film and the potential for increased actuation and energy harvesting", Soft Matter, vol. 13, Jan. 6, 2017, pp. 4552-4558.

Wu et al., "3D Printed Silicones with Shape Memory", Scientific Reports, vol. 7, Article 4664, Jul. 5, 2017, pp. 1-6.

Jang et al., "Mechanically Tunable Three-Dimensional Elastomeric Network/Air Structures via Interference Lithography", Nano Letters, vol. 6, No. 4, Mar. 15, 2006, pp. 740-743.

Rogers et al., "Materials and Mechanics for Stretchable Electronics", Science, vol. 327, Mar. 26, 2010, pp. 1603-1607.

Wolak et al., "Dielectric response of structured multilayered polymer films fabricated by forced assembly", Applied Physics Letters, vol. 92, Article 113301, Mar. 17, 2008, pp. 1-3.

(56) References Cited

OTHER PUBLICATIONS

Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.

Ieda, Masayuki, "Dielectric Breakdown Process of Polymers", IEEE Transactions on Electrical Insulation, vol. EI-15, No. 3, Jun. 1980, pp. 206-224.

Matyka et al., "How to Calculate Tortuosity Easily", AIP Conference Proceedings, vol. 1453, May 14, 2012, 6 pages.

Fratzl et al., "The mechanics of tessellations—bioinspired strategies for fracture resistance", Chem Soc Rev., vol. 15, No. 2, Jan. 21, 2016, pp. 252-267.

Cameron et al., "Linear actuation in coextruded dielectric elastomer tubes", ScienceDirect, Sensors and Actuators A: Physical, vol. 147, Issue 1, Sep. 15, 2008, pp. 286-291.

Sole et al., "Nano-emulsions prepared by the phase inversion composition method: Preparation variables and scale up", ScienceDirect, Journal of Colloid and Interface Science, vol. 344, Issue 2, Apr. 15, 2010, pp. 417-423.

Cheng et al., "Controlled In Situ Nanocavitation in Polymeric Materials", Advanced Materials, vol. 23, Issue 3, Jan. 18, 2011, pp. 409-413.

Solans et al., "Nano-emulsions: Formation by low-energy methods", ScienceDirect, Current Opinion in Colloid & Interface Science, vol. 17, No. 5, Oct. 1, 2012, pp. 246-254.

Gohtani et al., "Nano-Emulsions; Emulsification Using Low Energy Methods", Japan Journal of Food Engineering, vol. 15, No. 3, Sep. 1, 2014, pp. 119-130.

Michler et al., "The physics and micro-mechanics of nano-voids and nano-particles in polymer combinations", ScienceDirect, Polymer, vol. 54, No. 13, Jun. 7, 2013, pp. 1-14.

Preinterview first office action received for U.S. Appl. No. 16/262,433 dated Oct. 26, 2020, 58 pages.

Preinterview first office action received for U.S. Appl. No. 16/262,439 dated Nov. 30, 2020, 42 pages.

Final office action received for U.S. Appl. No. 16/351,477 dated Dec. 1, 2020, 38 pages.

Preinterview first office action received for U.S. Appl. No. 16/263,829 dated Dec. 22, 2020, 36 pages.

Notice of Allowance received for U.S. Appl. No. 16/364,977 dated Feb. 2, 2021, 40 pages.

Notice of Allowance received for U.S. Appl. No. 16/263,829 dated Feb. 4, 2021, 27 pages.

First Action Interview received for U.S. Appl. No. 16/262,433 dated Mar. 1, 2021, 12 pages.

Notice of Allowance received for U.S. Appl. No. 16/262,439 dated Apr. 6, 2021, 38 pages.

Notice of Allowance received for U.S. Appl. No. 16/351,477 dated Mar. 29, 2021, 28 pages.

\* cited by examiner ly embodiments and are a part of the specification.
NANOVOIDED POLYMERS USING PHASE INVERSION

CROSS REFERENCE TO RELATED APPLICATION

This application claims the benefit of U.S. Provisional Application No. 62/777,825, filed Dec. 11, 2018, the disclosure of which is incorporated, in its entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
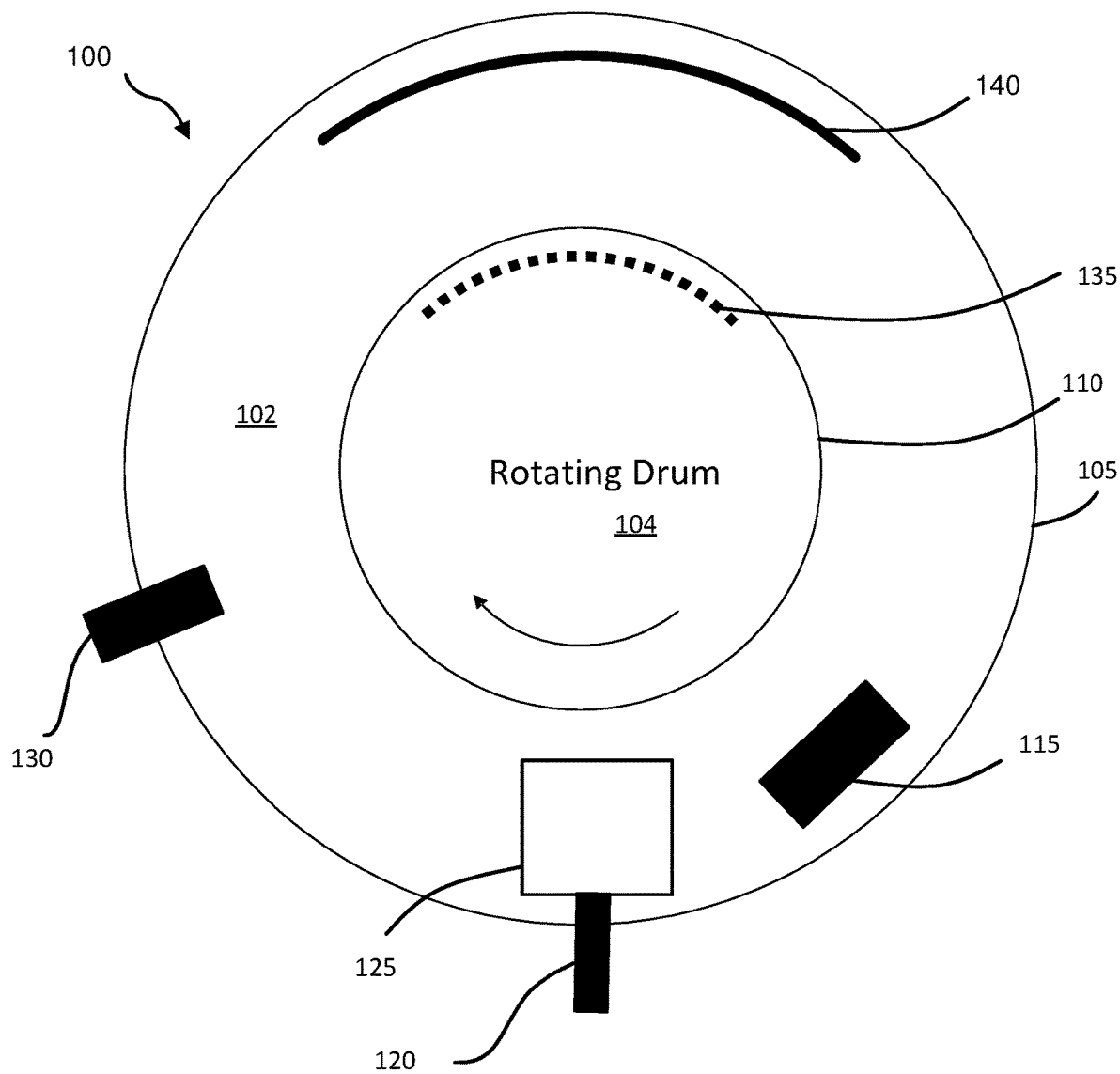
FIG. 1 shows a deposition apparatus, in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer materials may be incorporated into a variety of different optic and electro-optic architectures, including active and passive optics and electroactive devices. Electroactive polymer (EAP) materials, for instance, may change their shape under the influence of an electric field. EAP materials have been investigated for use in various technologies, including actuation, sensing, and/or energy harvesting. Lightweight and conformable, electroactive polymers may be incorporated into wearable devices (such as haptic devices) and are attractive candidates for emerging technologies, including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including their electrical, mechanical, and/or optical properties. There is a need for improved actuators, sensors, and optical elements, along with associated methods, for example, for applications in AR and VR devices.

The present disclosure is generally directed to nanovoided polymers (NVP), electroactive NVP elements, methods of preparing NVP elements, and apparatuses, methods, and systems including electroactive materials, such as nanovoided polymer (NVP) elements. Embodiments of the instant disclosure may include nanovoided polymers, layers thereof, electroactive and/or sensor elements including such nanovoided polymers, applications of nanovoided polymers in devices such as actuators, optical elements (which may include actuators), sensors, and combinations thereof, methods of fabrication of any of the above, and methods of operating any such device.

As will be described in greater detail below, examples of the instant disclosure include electroactive devices, such as actuators, sensors, and optical elements, having, for example, improved electrical and/or mechanical properties, such as improved electrical control of actuation and/or improved spatial resolution of sensing. Features from any of the embodiments described herein may be used in combination with one another in accordance with the general principles described herein.

Figure 3:
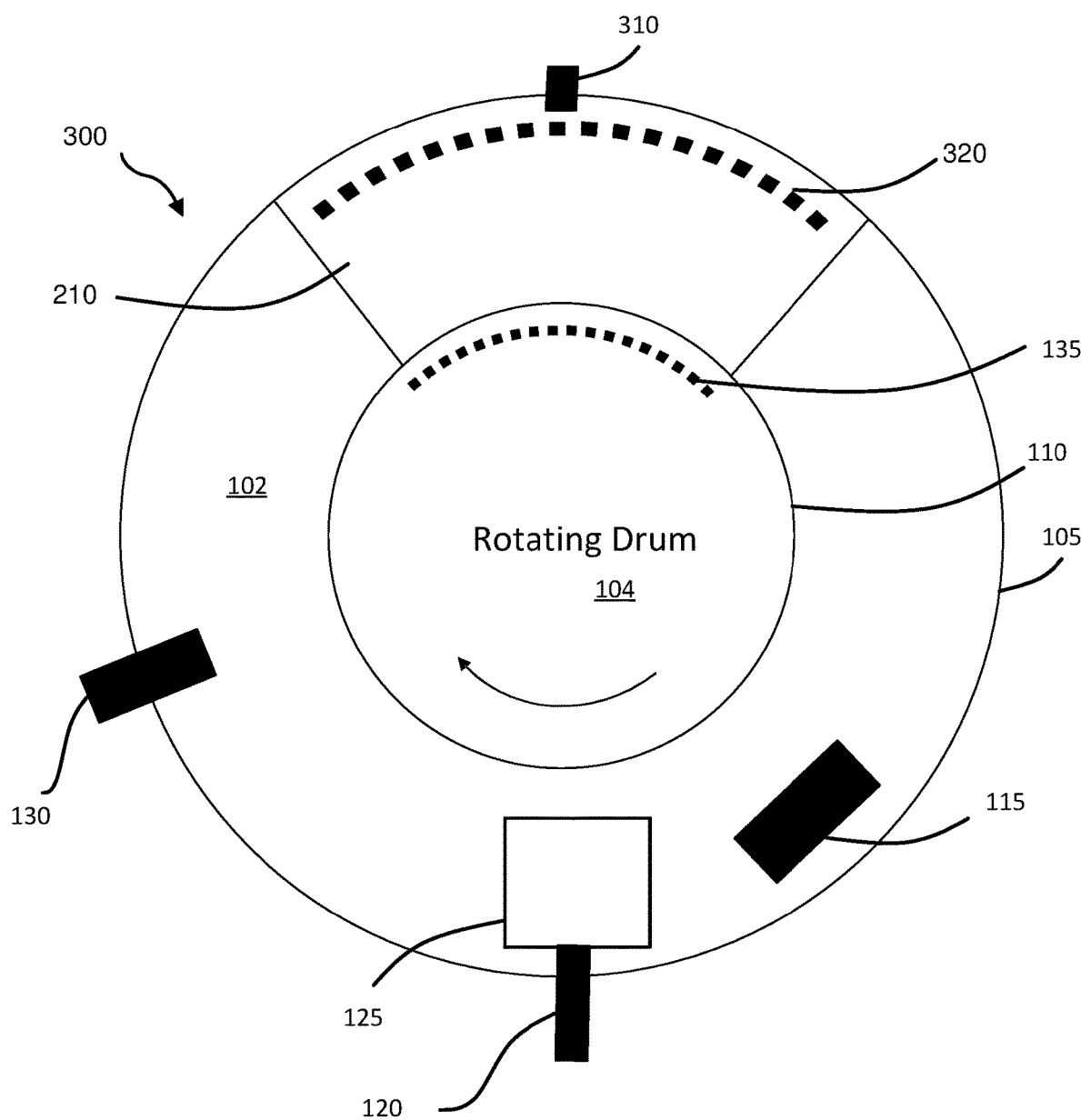
FIG. 3 shows a deposition apparatus including a pump and heater elements, in accordance with some embodiments.
Figure 4:
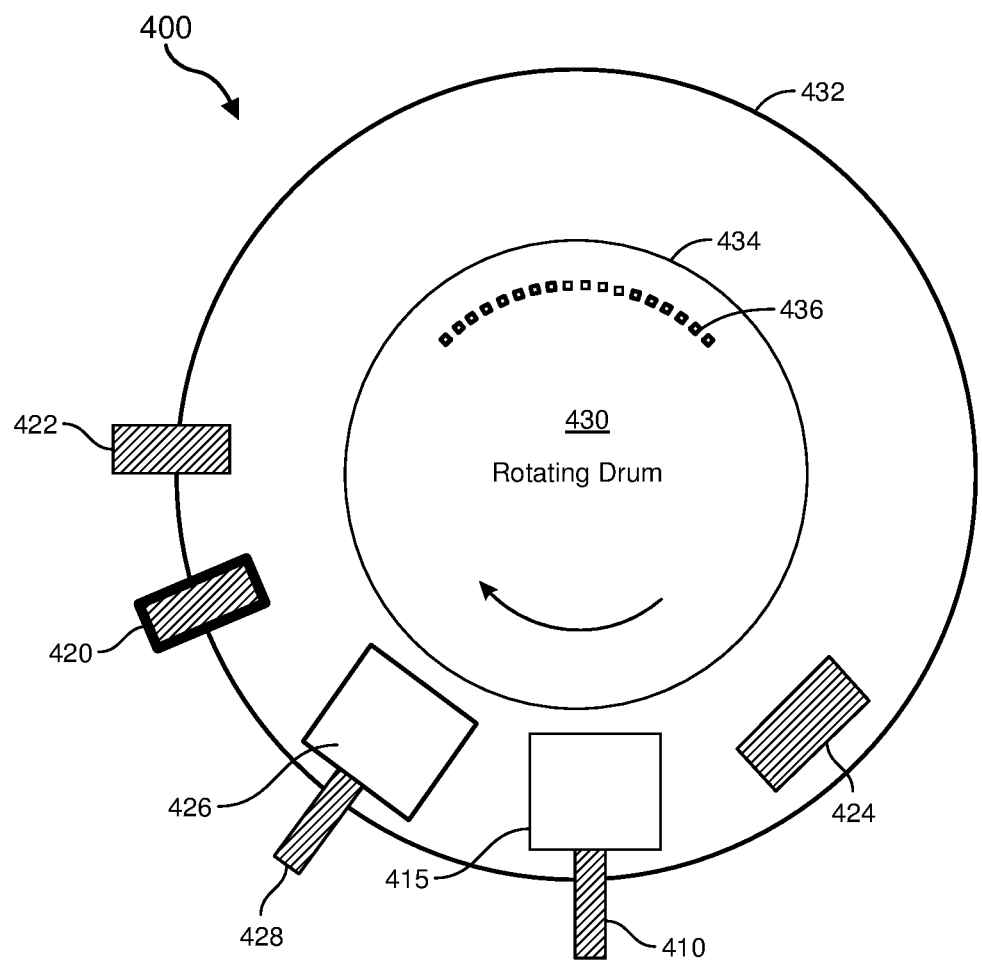
FIG. 4 shows a deposition apparatus which may be used to deposit a nanovoided polymer element, along with additional layers, in accordance with some embodiments.
Figure 5:
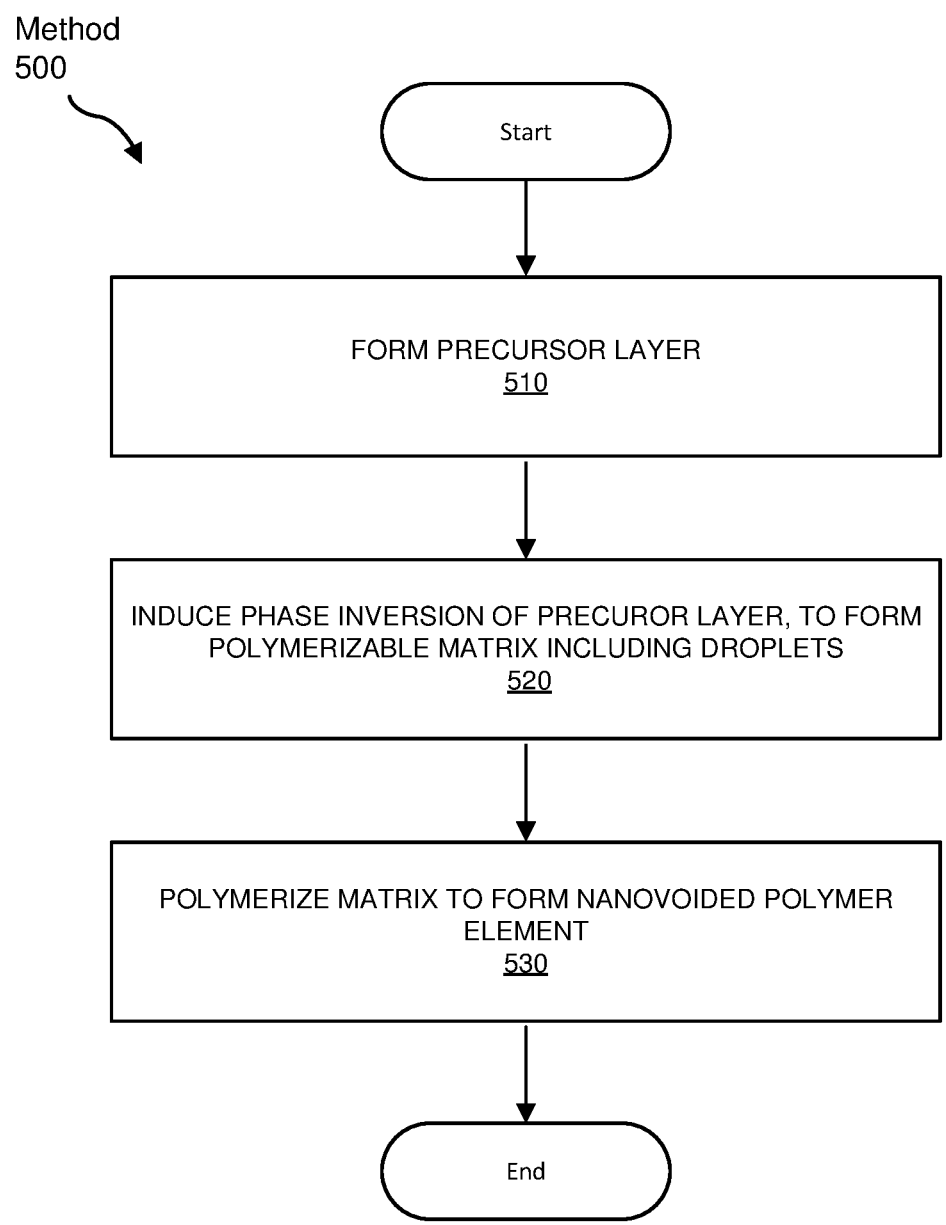
FIG. 5 shows a method of deposition including a phase inversion, in accordance with some embodiments.
Figure 6:
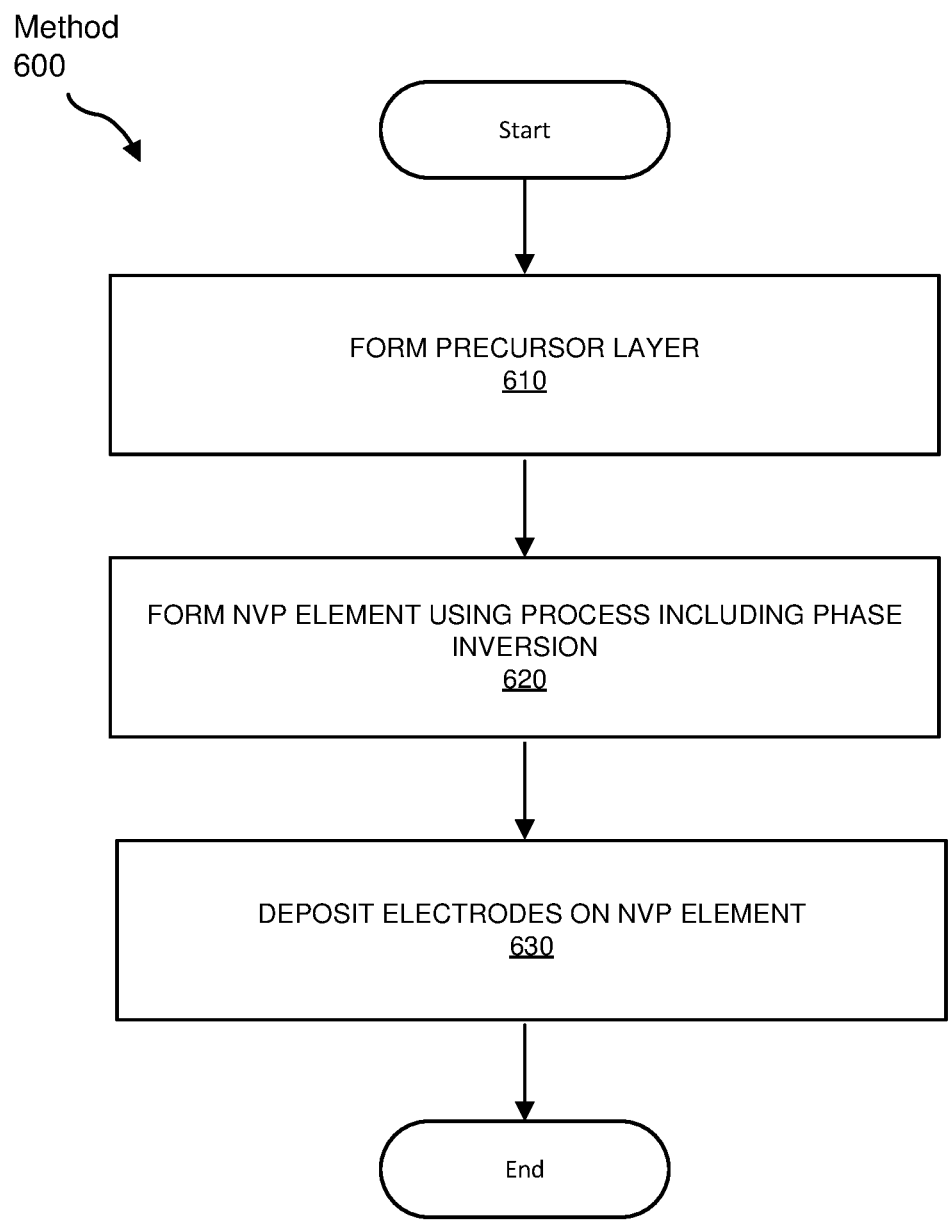
FIG. 6 shows a method of deposition including a phase inversion and deposition of electrodes, in accordance with some embodiments.
Figure 7:
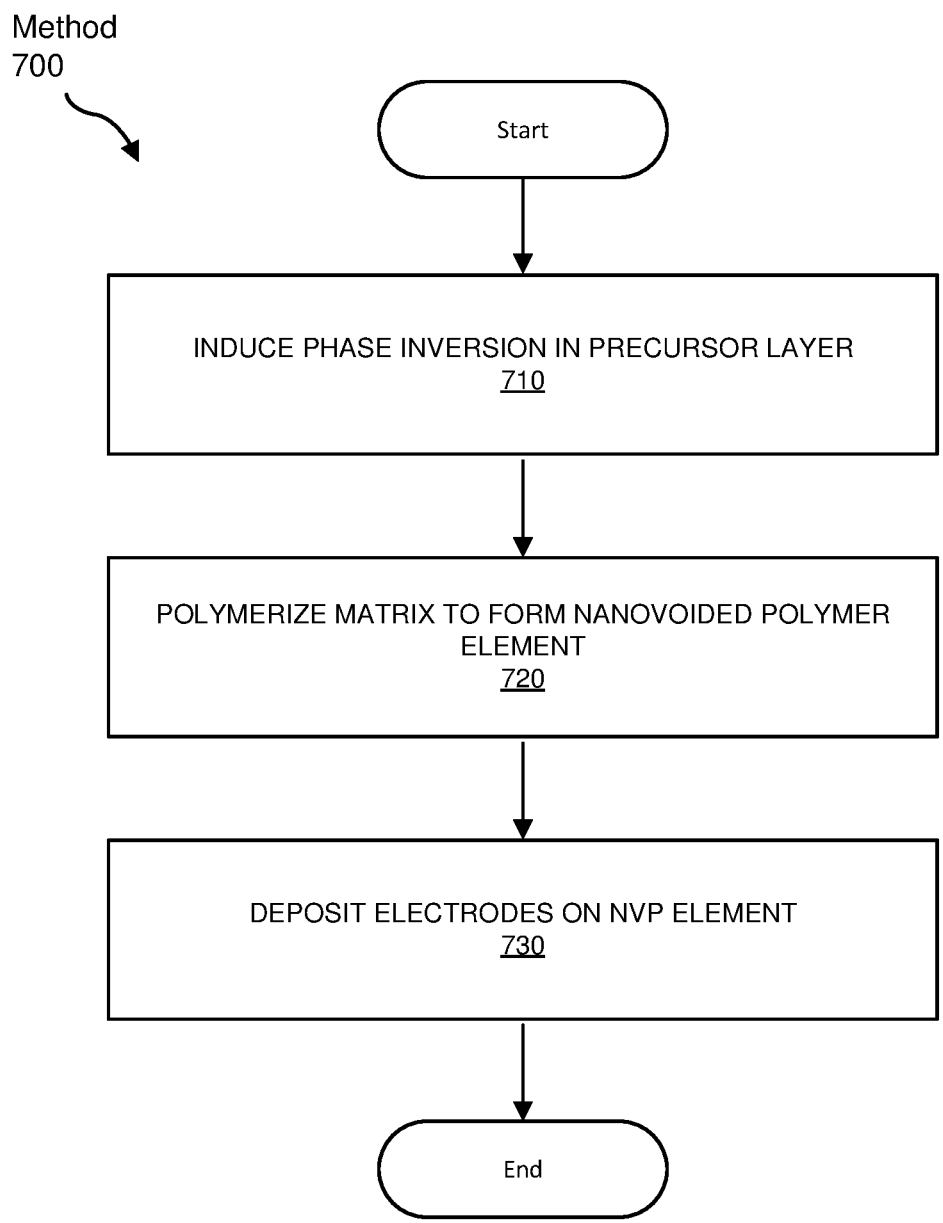
FIG. 7 shows a method of deposition including a phase inversion, in accordance with some embodiments.
Figure 8:
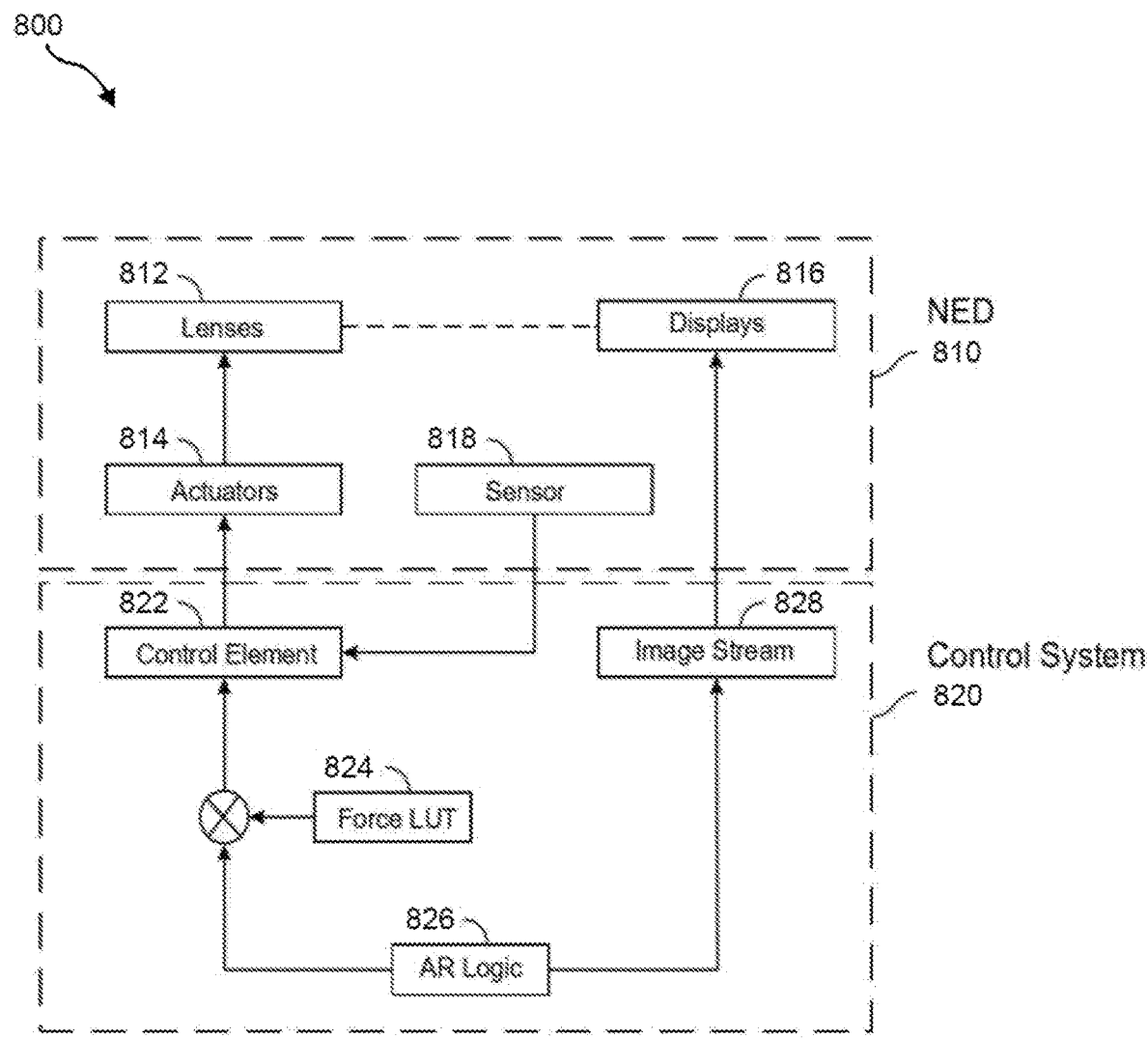
FIG. 8 is a system diagram showing how actuators and/or sensors may be used in an augmented reality and/or virtual reality system, in accordance with some embodiments.
Figure 9A:
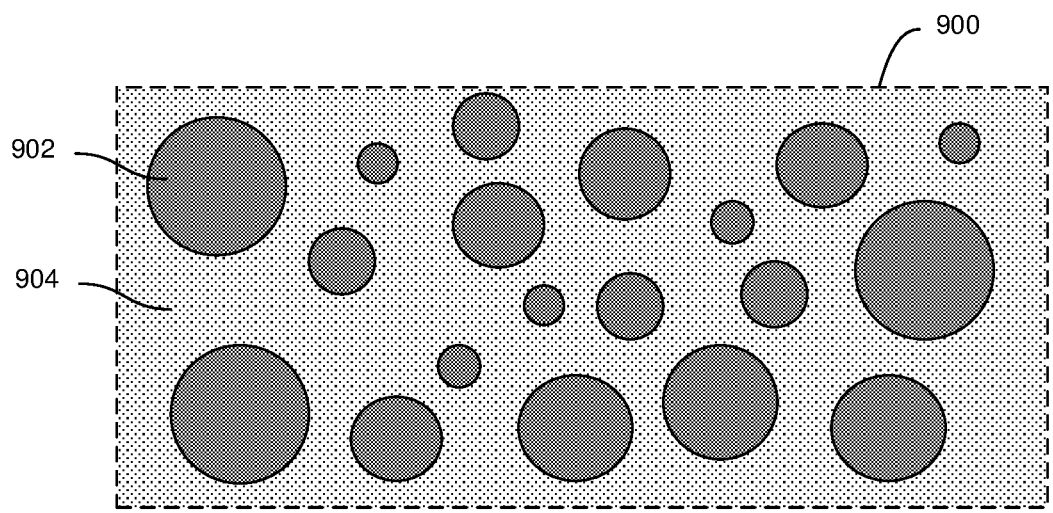
FIGS. 9A-9B depict a phase inversion, in accordance with some embodiments.
Figure 9B:
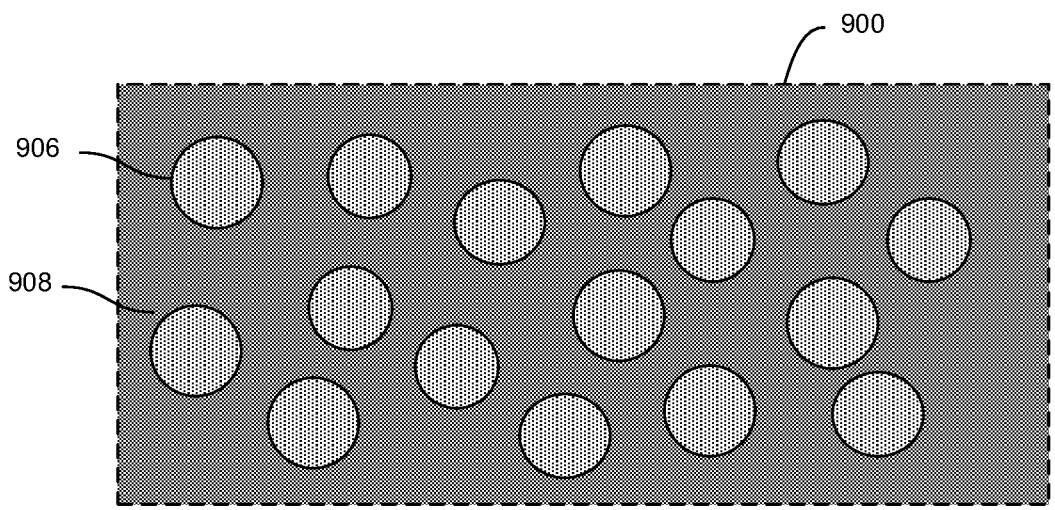
Figure 10:
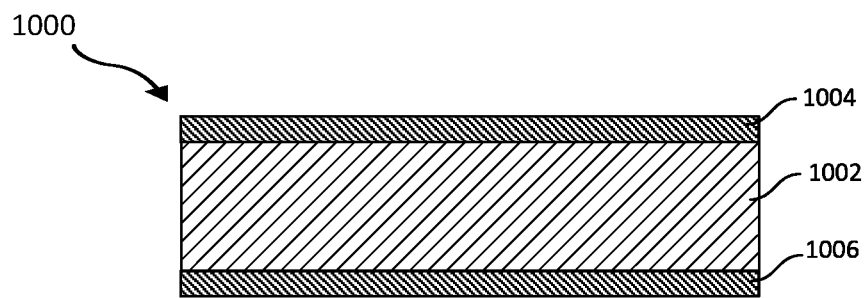
FIG. 10 depicts an exemplary nanovoided polymer element and electrodes, in accordance with some embodiments.

In examples described in more detail below, FIGS. 1-4 illustrate example deposition apparatus, FIGS. 5-7 illustrate example methods of deposition including a phase inversion, FIG. 8 is an example system diagram, FIGS. 9A-9B depict an example phase inversion, FIG. 10 depicts an exemplary nanovoided polymer element and electrodes, and FIGS. 11-16 depict exemplary augmented reality (AR) and/or virtual reality (VR) applications.

In some examples, a method of fabricating a nanovoided polymer includes depositing a precursor composition onto a substrate. The substrate may include one or more components and/or layers subsequently used in a device, such as a polymer layer, electrode, or similar. In some examples, the fabricated nanovoided polymer may be released from the substrate before further processing. The precursor composition may include at least one polymerizable species, such as one or more monomer molecular species, or one or more oligomer molecular species. The precursor composition may also include a liquid in which the monomer dissolves and/or a liquid immiscible with the monomer (or which does not dissolve the monomer, for example, if the monomer is solid, and which in some examples may not mix with any solvent used to dissolve the monomer). In some examples described herein, a polymerizable species may be referred to as a monomer for conciseness, though examples are not limited to the use of monomers, as other polymerizable species may be used, such as oligomers. In some examples, the term oligomers may include dimers, trimers, and the like.

In some examples, a precursor layer including the precursor composition may include droplets of the polymerizable material in a liquid mixture. The liquid mixture may be generally non-polymerizable, and may, for example, include one or more non-polymerizable liquids. The droplets of the polymerizable material may be formed before deposition, or in some examples may form during or after deposition of the precursor layer. In other words, the precursor composition may be deposited in a form including the droplets, the droplets may form within the precursor layer as the precursor composition is deposited, or the droplets may form after deposition of the precursor composition. The precursor layer may be a thin film, for example, having a precursor layer thickness of approximately 1 mm or less.

After deposition of the precursor layer, one or more properties of the precursor layer may then be modified to induce a phase inversion in the precursor layer, thereby obtaining droplets of a non-polymerizable liquid within a polymerizable liquid mixture. The non-polymerizable liquid may include, for example, one or more liquids immiscible with the polymerizable liquid mixture. In some examples, the polymerizable liquid mixture formed after phase inversion may include one or more polymerizable molecular species, such as one or more monomer molecular species and/or oligomer molecular species.

After deposition of the precursor composition, for example, as a precursor layer, and after phase inversion, the liquid mixture may be polymerized to form a polymer including nanovoids of non-polymerizable liquid. Optionally, the non-polymerizable liquid may then be removed to form an NVP element, for example, including gas-filled nanovoids, such as air-filled voids. The polymerizable liquid mixture may be polymerized to obtain a solid nanovoided polymer element including droplets including the non-polymerizable liquid. The non-polymerizable liquid may then be removed from the nanovoided polymer element, for example, using heat and/or reduced pressure.

A deposition process including a phase inversion may be used to prepare a nanovoided polymer (NVP), an NVP element such as an NVP layer, an electroactive NVP element, an electroactive device or a component thereof, or a device or system including a nanovoided polymer element. An NVP may be prepared in any form, such as in bulk, and then may be processed into an NVP element. In this context, an NVP element may include an NVP layer, optionally supporting one or more electrodes, and optionally configured as an electroactive device component.

The nanovoided polymer element may be formed on a substrate, which may include or be an electrode. Any other desired electrodes (and/or other materials, such as additional polymer layers) may then be deposited on the nanovoided polymer element. For example, a device may be fabricated having a first electrode and a second electrode, each electrode supported by a surface of the nanovoided polymer. An example device may include an electroactive device, such as an actuator and/or a sensor, and in some examples the device may include one or more optical elements. In example devices, such as the devices described herein, applying a voltage between electrodes of the NVP element may create at least 10% strain in the NVP element in at least one direction. In some examples, application of a voltage between a pair of electrodes may induce an appreciable electrostriction in at least a portion of the nanovoided polymer located between the electrodes.

In some examples, an electroactive device, such as an electroactive polymer device, such as an electroactive polymer actuator, includes a first electrode, an electroactive element, and a second electrode. The electroactive element may include an electroactive polymer layer, such as an NVP element. The NVP element may include a layer with a predetermined thickness, such as an undeformed thickness of less than approximately 10 microns, such as less than approximately 1 micron. In some examples, a nanovoided polymer element may include a layer having a thickness between 10 nm and 10 microns, for example, between approximately 100 nm and 2 microns, for example, between 200 nm and 1 micron. In some examples, layer thickness range end points may be approximate.

An example method of making a polymer element (such as a nanovoided polymer element, such as an electroactive NVP element) may include providing a substrate (which may include an electrically conductive layer such as an electrode), depositing a precursor composition including one or more polymerizable species (such as one or more monomers and/or one or more oligomers) onto the substrate to form a precursor layer, inducing a phase inversion in the precursor layer to obtain droplets of a non-polymerizable liquid in a polymerizable liquid mixture (e.g., including the one or more polymerizable species), and polymerizing the polymerizable liquid mixture to form a nanovoided polymer (NVP) element. At this stage, the NVP element may include liquid-filled nanovoids. The method may further include removing one or more remaining liquid components from the NVP element, depositing one or more electrodes (e.g., electrically conductive layers, such as metal layers) onto the NVP element, and fabricating a device including the NVP element, for example, fabricating an actuator and/or sensor.

In some examples, the polymerizable liquid mixture may include one or more components that do not become part of the polymer formed from polymerizing the polymerizable liquid mixture. In this context, the term "polymerizable liquid" may refer to any liquid including one or more polymerizable components, such as one or more monomers, one or more reactive oligomers, or a mixture thereof; and, for example, where a polymer is formed from the one or more monomers, the one or more reactive oligomers, or a mix of them. The resulting polymer may be nanovoided. The volume fraction of the nanovoids may be at least 10%, for example, at least 30%, in some examples at least 50%, and in some examples at least 70% of the polymer volume.

Non-polymerizable liquid may be removed from the NVP element by a liquid removal process, which may include one or more of the following: a change in pressure (e.g., application of a reduced pressure such as a vacuum or near-vacuum), a temperature change (e.g., an increase in temperature, using, for example, a heating element or IR light), evaporation (e.g., at ambient temperature and/or ambient or below-ambient pressure), application of a moving gas (e.g., blowing air, dry nitrogen, and the like), liquid exchange, other process, or a combination thereof.

In some examples, the components of the precursor composition may form an emulsion or other phase-separated mixture in which the polymerizable component (e.g., monomer component) forms droplets in a fluid mixture including one or more of the other components. A phase inversion may then be induced by changing one or more properties of the precursor composition (or precursor layer formed from the precursor composition), such as a change in one or more of the following: a temperature, addition of one or more salts (such as inorganic salts), addition of one or more other chemical species, evaporation of a liquid component of a mixture, and/or a change in the volume fraction of any component of the precursor composition, for example, by adjusting the evaporation rate of that component or any other components during or after the deposition of the precursor layer.

After phase inversion, the polymerizable component (e.g., including one or more monomers) may form a fluid mixture in which non-polymerizable liquid droplets (e.g., droplets including the non-polymerizable liquid and any other of the precursor composition components) are dispersed. The monomer may then be polymerized and the non-polymerizable liquid removed to provide a voided polymer element, such as a nanovoided polymer element. In some examples, a nanovoided polymer element may be cross-linked after fabrication, for example, if a cross-linking agent is included in the precursor composition.

A surprising advantage of the phase inversion approach of nanovoided polymer element fabrication is an improvement of the monodispersity of void diameters (or other dimension representative of void size). In the pre-inversion phase, polymerizable droplets may coalesce, for example, leading to large monomer-containing droplets. However, after phase inversion, largely monodisperse droplets including non-monomer components are obtained. The precursor composition after phase inversion may then be polymerized to effectively lock in the improved monodispersity of void size distribution. The improved monodispersity obtained using a phase inversion based approach greatly reduces the probability of there being one or more voids within an NVP layer having a diameter (or similar internal dimension) that approaches the layer thickness, in particular for an example layer thickness between approximately 10 nm and approximately 10 microns. Hence, the phase inversion approach improves the electrical breakdown properties of the NVP layer fabricated using such an approach, and reduces the chance of electrical breakdown at lower voltages. Examples include nanovoided polymer layers fabricated using a method that includes a phase inversion, having an electrical breakdown voltage that is appreciably greater than that of a similar layer fabricated by a method that does not include a phase inversion.

In some examples, a nanovoided polymer element has a void size distribution that is appreciably narrower than that obtained using a deposition process that does not include. a phase inversion. A narrower void size distribution may improve reproducibility and reliability of device properties. In some examples, a narrower void size distribution may increase a voltage breakdown threshold. In some examples, a narrower void size distribution may increase the spatial resolution of actuation and/or sensing, for example, by lowering the number of relatively large voids. The increased monodispersity also may improve the optical properties of layers (such as NVP layers) fabricated using a phase inversion based method, for example, by improving the homogeneity of the refractive index of the layer, and hence improving the uniformity of optical properties. Examples include nanovoided polymer layers fabricated using a method that includes a phase inversion, having a refractive index uniformity that is appreciably greater than that for a similar layer fabricated by a method that does not include a phase inversion.

In some examples, a precursor composition (such as a precursor layer formed by depositing a precursor composition onto a substrate) may include a surfactant. Formation of emulsions may be facilitated by, or require, a surfactant. The surfactant may be ionic, or nonionic (such as sorbitane monooleate). A phase inversion, triggered, for example, by a change in temperature, may be used to create droplets of non-polymerizable liquid in a liquid mixture including a polymerizable material, such as one or more monomers. Polymerization of the polymerizable material, such as the monomer(s), then may create a polymer matrix including nanodroplets of the non-polymerizable liquid.

After polymerization, any solvent used to dissolve the monomer may become excluded from the polymer mixture, and become a component of droplets of a non-polymerizable liquid within the nanovoided polymer mixture. The optional removal of the non-polymerizable liquid may then provide a nanovoided polymer (NVP) element, for example, an NVP element with gas-filled nanovoids. After formation of the NVP, electrodes may be deposited on an NVP surface, and/or one or more additional layers may be deposited on the NVP. In some examples, a substrate for deposition of the NVP element may include one or more electrodes, and additional electrodes may be deposited after formation of the NVP element. The electrode material may be a thin, optionally flexible, electrically conductive layer.

As described further below, example methods to form an NVP may include emulsification via a phase inversion. Example methods may be performed, at least in part, by a deposition apparatus such as a deposition apparatus as described herein.

FIG. 1 shows an example deposition apparatus 100, which may include a chamber 102 defined by chamber wall 105, a rotating drum 104 having a surface 110, an electrode deposition source 115, a deposition source 120, a vaporizer 125, a heater 135, a radiation source 130, and a cold trap 140, The chamber may be an evacuated chamber, for example, a chamber having an internal pressure appreciably less than a typical atmospheric pressure. An NVP element (and in some examples electroactive elements used in, for example, actuators and sensors) may be formed on the surface 110 in the chamber 102, where an electrode source 115 deposits a conductive material on the surface 110. The apparatus may include a deposition source 120 for one or more polymerizable materials (such as one or more monomers). The deposition source 120 (or a separate deposition source) may also be used to deposit a solvent, and optionally a surfactant and non-solvent may also be deposited (e.g., evaporated) onto the electrode layer (or other substrate). The evaporated layers of NVP material may be allowed to diffuse into each other thereby preparing a dispersed phase. To ensure a homogeneously dispersed phase, these NVP materials (e.g., monomers, solvent, surfactant, non-solvent) may all be co-evaporated at the same time by introducing them all into the vaporizer 125 at the same time, or the materials may be deposited as separate layers in any possible order, or some of the materials may be co-deposited (e.g., co-evaporated) while other materials may be evaporated as a separate layer.

The electrode layer may be pretreated with a gas, plasma or film, for example, to provide a suitable surface energy for the homogeneous diffusion of the NVP materials into one another. By adjusting the temperature of the system with heater 135, emulsification via phase inversion may be triggered leading to the formation of nanoscale solvent droplets dispersed in a continuous phase. The size of the droplets may be determined by the interfacial surface tension and may be influenced by the choice of surfactant and concentration and the speed at which the phase inversion is triggered. Emulsification can optionally also be triggered by adding salts, or by changing the volume fraction of the phases during the evaporation.

After the emulsification, a radiation source 130, for example, a source of actinic radiation such as UV-visible radiation) is incident on the precursor layer, and may polymerize the polymerizable material (such as one or more monomers) to form the polymer matrix of the nanovoided polymer element. Upon polymerization and/or crosslinking, the solvent nanodroplets may be entrapped in the polymer matrix. A source of actinic radiation 130 may be used to polymerize (e.g., cure) monomers or other polymerizable materials in the precursor layer. Suitable actinic radiation includes visible light (such as blue light, or violet light), UV radiation, x-rays, gamma rays, and electrons.

After polymerization (e.g., of one or more monomers), any remaining liquid components may be allowed to evaporate or otherwise be removed (at least in part) before the next electrode layer is applied. Evaporation of the solvent may be accelerated by the application of heat to the substrate 110 with heater 135, or by reducing the pressure of the solvent above the substrate, for example, with a cold trap 140, or a combination thereof.

If there are non-polymerizable liquids (such as monomer solvents and/or liquids that are immiscible with the monomer) present in the deposited layer, the deposited layer may then be hardened or converted to a desired state, for example, by drying, radiation exposure, exposure to low pressure, or other process.

The surface on which the NVP element is formed may be the surface of a rotating drum, as discussed herein, or other moving surface, such as a linearly moving surface. Alternatively, the surface on which the NVP element is formed may be fixed, and the deposition sources and/or curing components may move relative to the surface. In some examples, both the surface and the deposition and/or curing components may both be moveable.

A deposition apparatus, such as the example shown in FIG. 1, may include one or more shadow masks to control the patterns of the deposited materials as required by the product design. Multiple layers of the NVP and the electrode material may be formed to produce the desired electroactive element (e.g., as a layer stack). An example deposition apparatus may be used to fabricate a nanovoided polymer, an electroactive element including a nanovoided polymer, or a component of any device using such an electroactive element. In some examples, fabrication may include electrode deposition though this is optional.

Electrodes may be deposited onto the electroactive element. For example, first and second electrodes may be deposited so that at least part of the electroactive element lies between the electrodes. In some examples, a plurality of electrode pairs may be deposited. An electrode may be formed from an electrode material, such as a metal, alloy, or other conducting material such as graphite, graphene, carbon nanotubes, electrically conducting polymers, semiconductors, semi-metals, and the like. Suitable electrode materials include aluminum, indium, gallium, zinc, and other metals. Other conductive materials may be used including carbon nanotubes, graphene, transparent conductive oxides, and the like. The electrode coater may be a thermal evaporator, a sputtering system, or a spray coater.

The electrode layer may be very thin, for example, between approximately 10 and approximately 50 nm thick. The electrode layer may be designed to allow healing of electrical breakdown in the EAP layer. A typical thickness of a self-healing aluminum electrode may be, for example, about 20 nm. The electroactive polymer layers may be as thin as approximately 100 nm or less, and up to approximately 1000 nm or more. In some examples, the electroactive polymer layers are between approximately 100 and approximately 1000 nm, for example, between about 200 and about 500 nm. In some configurations, flexible electrodes may be used, for example, using electrodes that can elastically stretch. In other applications, relatively rigid electrodes such as aluminum may be used.

Figure 2:
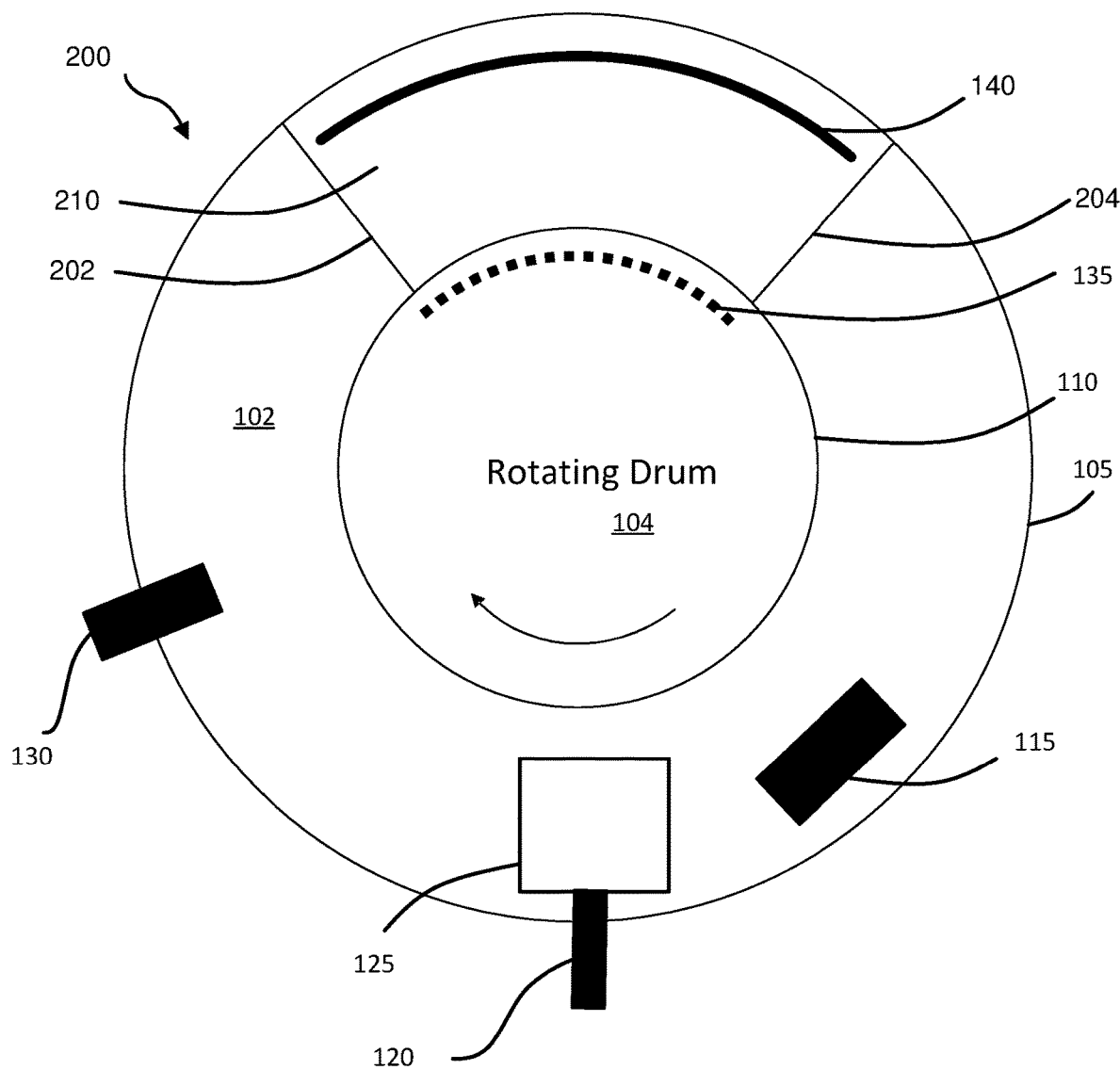
FIG. 2 shows a deposition apparatus including a sub-chamber enclosing a cold trap, in accordance with some embodiments.

FIG. 2 shows a variation of the apparatus presented in FIG. 1, which may enable a more efficient evaporation of the solvent, and may prevent the solvent vapor from interfering with the curing source 130 or the electrode source 115. The apparatus 200 may have the cold trap 140 enclosed in a sub-chamber 210, defined by barriers 202 and 204. In this configuration, the cold trap 140 may be effectively separated from the rest of the chamber by enclosing the cold trap in a sub-chamber 210. The barriers 202 and 204 may be sized or adjusted to allow the NVP element (or precursor thereof) to enter the sub-chamber 210. The pressure in the sub-chamber 210 may be controlled independently of the pressure in the rest of the chamber 102, enabling a guided evaporation of the solvent into the sub-chamber, minimizing the interference of solvent with other components in the chamber. The remaining figure elements are as described in FIG. 1.

FIG. 3 shows a variation of the apparatus presented in FIG. 2, where the non-solvent is not condensed but may be pumped out of the system using a pump. The apparatus includes pump 310 and second heater 320, and omits the cold trap 140 shown in FIGS. 1 and 2. The pressure in the sub-chamber 210 may be controlled independently of the pressure in the rest of the chamber, enabling a guided evaporation of the solvents and non-solvents into the sub-chamber, minimizing their interference with other components in the chamber. This process can be better guided and sped up using heater 320. The heater 320 may include one or more infrared (IR) heater elements. The remaining figure elements are as described in FIGS. 1 and 2.

FIG. 4 shows a further example of a deposition apparatus, which may additionally be used to form one or more additional layers on an NVP fabricated using a process including a phase inversion. The apparatus 400 may include a rotating drum 430 having a surface 432, chamber wall 432, drum heater 436, one or more material sources (in this example, first material source 410 and second material source 428), one or more vaporizers (in this example, first vaporizer 415 and second vaporizer 426), one or more radiation sources (in this example, first radiation source 420 and second radiation source 422), and an electrode material source 424. For example, the first vaporizer may be used for polymer deposition related to NVP formation, and second vaporizer may be used for polymer deposition related to the formation of the additional layer. Radiation sources 420 and 422 may be used for, for example, for polymerization (e.g., curing) of polymer precursors (e.g., monomers), surface melting, or other suitable purposes. The electrode material source may be configured to deposit, for example, metal or electrically conductive metal oxide films onto an NVP element.

In some examples, the apparatus of FIG. 4 may be used for the fabrication of an electroactive device (e.g., an actuator), including a nanovoided polymer element. In some examples, apparatus 400 may be used for fabricating an electroactive device having electroactive polymers with nanovoids, and additional layers such as electrodes formed thereon.

Deposited monomers may be monofunctional or multifunctional, or mixtures thereof. Multifunctional monomers may be used as crosslinking agents to add rigidity or to form elastomers. Multifunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms. A deposited polymer precursor may be combined with a sacrificial material (e.g., a liquid that may be subsequently evaporated to provide a nanovoided structure). In some examples, a deposited polymer precursor may be combined with nanoparticles (e.g., metal or dielectric nanoparticles) to, for example, increase the dielectric constant of the formed polymer materials.

In some embodiments, a deposition apparatus (such as apparatus 100. 200, 300, or 400) may include one or more vaporizers, and each of the one or more vaporizers may apply a different material, for example, one or more of the following: monomers or other polymer precursors, surface energy modifiers (e.g., to modify the surface energy of a substrate, to enhance or eliminate wetting and/or infusion, etc.), a sacrificial material such as a liquid that is subsequently evaporated to leave a void, a ceramic precursor such as an ormosil precursor, such as tetraethyl orthosilicate and water, other polymerizable and/or non-polymerizable materials, surfactants, other emulsion promoters, phase inversion promoters, or a catalyst for forming a sol gel such as HCl or ammonia.

In some examples, a deposition apparatus may be configured to deposit an emulsion promoter onto the surface, or onto the precursor layer. The emulsion promoter may induce (or help induce) emulsification in the precursor layer. An emulsion promoter may include a salt, a pH adjuster, a surfactant, or the like.

In some examples, a deposition apparatus may be configured to deposit a phase inversion promoter onto the precursor layer. The phase inversion promoter may induce (or help induce) phase inversion in the precursor layer. A phase inversion promoter may include a salt, a pH adjuster, a surfactant, or the like.

In some examples, a deposition apparatus may include one or more further heaters, other sources, additional exhaust ports, and the like. Pressure may be adjustable, to extract liquid components from a polymerized element. Ranges may be inclusive, and range limits approximate. In some examples, waste liquid components may be directed in certain directions to avoid contaminating sources of deposited materials, for example, using some combination of heating, a directed gas flow, a lower pressure exhaust chamber, closing ports associated with sources, and the like.

A deposition apparatus, such as apparatus 400, may further include one or more additional nozzles (e.g., vaporizers, radiation sources, and the like), for example, an additional nozzle for plasma treatment of the NVP surface before deposition of the planarization layer. A plasma treatment may be used to modify the surface structure of the planarization layer, for example, generating free radicals or other chemical moieties. The surface modification may help exclude components of the planarization layer from entering the voids (e.g., pores) of the NVP as the planarization layer is deposited on to the surface of the NVP. In some examples, a planarization layer material may be used to form the planarization layer that has appreciably higher surface energy than that of the NVP (or surface treated NVP, if appropriate).

In some examples, the precursor solution may deposit directly into a desired phase, so that phase inversion is not required in such examples. In some examples, a method of fabricating a nanovoided polymer includes depositing a precursor composition onto a substrate, the precursor composition including one or more monomers, the precursor solution including droplets of a non-polymerizable liquid within a polymerizable liquid mixture, polymerizing the polymerizable liquid mixture to obtain a solid nanovoided polymer including droplets of the non-polymerizable liquid, removing the non-polymerizable liquid to obtain a nanovoided polymer element. In such example approaches, phase inversion is not needed.

Example methods of forming a nanovoided polymer include using a deposition apparatus, which may include a rotating drum as discussed above, or other configuration. In some examples, a precursor composition forms an initial emulsion phase, for example, of monomer droplets in a non-polymerizable liquid mixture. Phase inversion may be induced, for example, by changing ambient conditions (such as pressure, or temperature), modifying one or more component concentrations (e.g., by allowing a relatively volatile component to selectively evaporate, or adding more of one or more components to the precursor composition, for example, by increasing a volume fraction of a monomer), or adding one or more additional components to the precursor composition (e.g., another liquid component, a salt, or salt solution). In some examples, a phase inversion may be induced by heating using radiation, such as IR radiation or microwave radiation, heating a substrate, or heating an ambient medium such as a gas. A surfactant may be included in the precursor composition, for example, to stabilize an initial emulsion phase, or a phase obtained by phase inversion or both. A precursor composition may include one or more monomers. A precursor composition may include monomers, such as monofunctional monomers (e.g., to cap polymerization), bifunctional monomers, other multifunctional monomers, or a combination thereof. In some examples, an NVP element may be cross-linked during or after the polymerization of a monomer or other polymerizable material (such as an oligomer).

In some examples, a monomer component may be combined with a solvent to produce the NVP. In some examples, phase inversion may occur leaving solvent-filled voids in a polymer (or polymer precursor, e.g., monomer) mixture. Any additional layers (such as additional polymer layers, electrodes, and the like) may be applied either before or after some or all of the solvent has been evaporated from the NVP. In the former case, a solvent is used that does not mix with any additional polymer layer, or the polymer layer may be cured quickly to suppress diffusion of the solvent into the layer. In the latter case, there are may be little restriction on the polymer layer material. In some examples, an additional polymer layer may be applied even before curing the NVP polymer. In this case, a solvent may be used that does not mix with the polymer layer, or the polymer layer may be cured quickly together with the NVP layer to suppress diffusion of the solvent into the polymer layer. In some examples, an additional layer may be formed by vaporizing the layer material in a vaporizer, or any other deposition approach may be used. In some examples, a polymer layer may be cured with a source of radiation, such as radiation source 420 shown in FIG. 4. Additional polymer layers may include planarization layers, dielectric layers, or other polymer layers. In some examples, a multilayer including NVP and other layers may be formed by repeating the NVP deposition and other layer deposition as desired. An example deposition system may use shadow masks to control the patterns of the deposited materials as required by the product design. The radiation source 420 may include one or more radiation sources such as an e-beam, visible light, UV light, x-ray, or other actinic radiation or particle source.

FIG. 5 shows an example method of deposition, in accordance with some embodiments. The method 500 includes depositing a precursor composition onto a substrate to form a precursor layer (510). The precursor composition may include a matrix material including droplets. The droplets may include a polymerizable material, such as a monomer. The method may further include inducing a phase inversion in the precursor layer to obtain droplets of a non-polymerizable liquid within a polymerizable liquid mixture, (520). The method may further include polymerizing the polymerizable liquid mixture to obtain a nanovoided polymer element (530). The nanovoided polymer element may include droplets of the non-polymerizable liquid. The droplets of non-polymerizable liquid may optionally BE removed, for example, to obtain a nanovoided polymer element having air-filled voids.

FIG. 6 shows an example method of deposition, in accordance with some embodiments. The method 600 includes depositing a precursor composition onto a substrate to obtain a precursor layer (610), forming a nanovoided polymer element from the precursor layer using phase inversion and matrix polymerization (620), and further depositing a first electrode and a second electrode onto the nanovoided polymer element (630).

FIG. 7 shows an example method of deposition, in accordance with some embodiments. The method 700 includes inducing a phase inversion in a precursor layer to obtain a polymerizable mixture including non-polymerizable droplets (710), polymerizing the polymer mixture to form a nanovoided polymer layer (720), and further depositing a first electrode and a second electrode onto the nanovoided polymer element (730).

An example method may further include fabricating a device including the nanovoided polymer element, for example, where the device is an actuator or a sensor. Depositing the precursor composition onto a substrate may include depositing the precursor composition using a deposition process including one or more of evaporation, spin coating, inkjet printing, non-inkjet printing, vapor deposition, vapor coating, thermal spraying, lamination, mist deposition, extrusion (e.g., co-extrusion of a plurality of components), or transfer of a separately formed material film. In some examples, the monomer includes an acrylate, an ether, an amide, an acrylamide, an amine, a vinyl, an epoxy, a siloxane or other silicon-containing monomer, or an isocyanate.

FIG. 8 shows an example system, illustrating how NVP-based actuators may be used in an AR/VR system. In some example systems, NVP based actuators may be used to control optical elements (lenses). NVP-based sensors may also be used. A control element may be used to receive sensor data and control application of drive signals to the actuators. As shown in FIG. 8, a near-eye display system 800 may include a near-eye display (NED) 810 and a control system 820, which may be communicatively coupled to each other. The near-eye display 810 may include lenses 812, electroactive devices 814, displays 816, and a sensor 818. Control system 820 may include a control element 822, a force lookup table 824, and augmented reality (AR) logic 826. In some examples, an NVP-based actuator (or sensor) may include a nanovoided polymer element having a planarization layer on at least one surface thereof. One or more electrodes (such as an electrode pattern) may be deposited on the planarization layer.

Augmented reality logic 826 may determine what virtual objects are to be displayed and real-world positions onto which the virtual objects are to be projected. Accordingly, augmented reality logic 826 may generate an image stream 828 that is displayed by displays 816 in such a way that alignment of right- and left-side images displayed in displays 816 results in ocular vergence toward a desired real-world position.

Control element 822 may use the same positioning information determined by augmented reality logic 826, in combination with force lookup table (LUT) 824, to determine an amount of force to be applied by electroactive devices 814 (e.g., actuators), as described herein, to lenses 812. Electroactive devices 814 may, responsive to control element 822, apply appropriate forces to lenses 812 to adjust the apparent accommodation distance of virtual images displayed in displays 816 to match the apparent vergence distance of the virtual images, thereby reducing or eliminating vergence-accommodation conflict. Control element 822 may be in communication with sensor 818, which may measure a state of the adjustable lens. Based on data received from sensor 818, the control element 822 may adjust electroactive devices 814 (e.g., as a closed-loop control system).

In some examples, display system 800 may display multiple virtual objects at once and may determine which virtual object a user is viewing (or is likely to be viewing) to identify a virtual object for which to correct the apparent accommodation distance. For example, the system may include an eye tracking system (not shown) that provides information to control element 822 to enable control element 822 to select the position of the relevant virtual object.

Additionally or alternatively, augmented reality logic 826 may provide information about which virtual object is the most important and/or most likely to draw the attention of the user (e.g., based on spatial or temporal proximity, movement, and/or a semantic importance metric attached to the virtual object). In some examples, the augmented reality logic 826 may identify multiple potentially important virtual objects and select an apparent accommodation distance that approximates the virtual distance of a group of the potentially important virtual objects.

Control system 820 may represent any suitable hardware, software, or combination thereof for managing adjustments to adjustable lenses 812. In some examples, control system 820 may represent a system on a chip (SOC). As such, one or more portions of control system 820 may include one or more hardware modules. Additionally or alternatively, one or more portions of control system 820 may include one or more software modules that perform one or more of the tasks described herein when stored in the memory of a computing device and executed by a hardware processor of the computing device.

Control system 820 may generally represent any suitable system for providing display data, augmented reality data, and/or augmented reality logic fora head-mounted display.

In some examples, control system 820 may include a graphics processing unit (GPU) and/or any other type of hardware accelerator designed to optimize graphics processing. Control system 820 may be implemented in various types of systems, such as the augmented reality glasses.

FIGS. 9A-9B illustrate an example phase inversion in a precursor layer. FIG. 9A shows a simple schematic representation of a portion of a precursor layer 900 (denoted by the dashed line), including droplets of a polymerizable material 902 suspended in a non-polymerizable mixture 904. This may represent, for example, a portion of a precursor layer deposited onto a substrate using a deposition apparatus, such as a deposition apparatus as described herein. FIG. 9B shows the modified structure of the portion of the precursor layer 900 after phase inversion. The modified precursor layer has droplets of a non-polymerizable material 906 in a polymerizable mixture 908. The size distribution of the droplets after phase inversion may be relatively narrow, compared with that obtained for a similar structure obtained by direct deposition.

FIG. 10 shows a device 1000 including a nanovoided polymer (NVP) element 1002, a first electrode 1004 on a first surface of the NVP element, and a second electrode 1006 on a second surface of the NVP element. In some examples, a control circuit may be used to apply voltages between the first electrode and the second electrode to obtain actuation, for example, by electrostriction of the NVP element, for example, in a direction parallel to the applied electric field.

Deposition of a polymer, or a precursor composition, may include a process including, for example, chemical vapor deposition, or vapor coating. Example nanovoided polymers (NVPs) may include the polymerization of one or more monomers. The term polymerization may include co-polymerization. A nanovoided polymer may be formed using one or more monomers such as: acrylates (e.g., ethyl acrylate, butyl acrylate, octyl acrylate, ethyl acrylate (and derivatives such as ethoxyethyl acrylate, or ethoxyethoxy ethyl acrylate, and the like), chloromethyl acrylate, methacrylic acid, other acrylates, or some combination thereof), ethers (such as 2-chloroethyl vinyl ether, allyl glycidyl ether, other ethers, or some combination thereof), acrylamides (such as N-methylol acrylamide), amides, styrenes, other vinyl polymers, epoxides, isocyanates, and mixtures thereof. One or more monomers may be combined with a curing agent, such as polyamines, higher fatty acids or their esters, or sulfur may be used. A precursor composition for NVP fabrication may include polymers dissolved in a non-polymerizable material such as a solvent, such as an aliphatic, aromatic, or halogenated hydrocarbon, or a combination thereof. The precursor composition may include a non-solvent (e.g., a liquid immiscible with the monomer components) to create an emulsion, for example, of droplets including a polymerizable material, such as a monomer, in a liquid mixture of an immiscible liquid. The non-solvent may be organic or inorganic, for instance water or a hydrocarbon, or a highly polar organic compound such as ethylene glycol.

In some examples, a method of making a nanovoided polymer includes using a phase inversion of a precursor composition, such as a precursor layer. The method may include forming an NVP element from a precursor composition. In some examples, a precursor composition includes a monomer, such as a monomer which can be polymerized into a polymer component of the NVP matrix. In some examples, a precursor composition may include a monomer and liquid, such as a non-polymerizable liquid which may be immiscible with the monomer (or monomer solution, if a monomer solution is used). In some examples, a precursor composition may include a monomer, a non-polymerizable liquid, and a surfactant. Optionally, a precursor composition may include additional components such as a non-surfactant, or a solvent for the monomer, for example, if the monomer is not a liquid. The precursor composition may be deposited onto a substrate by any appropriate deposition process, such as evaporation, vapor deposition, spin coating, printing (such as ink jet printing), and the like.

In some examples, a monomer may include monofunctional, bifunctional, and/or multifunctional acrylates, as well as initiators. In some examples, polymers may be cross-linked, for example, during polymerization or during a separate cross-linking step later. For example, a nanovoided polymer element (or a precursor thereof) may be polymerized, pre-stretched (or otherwise deformed), and a cross-linking then used to hold the pre-stretch or other deformation. In some example, a phase inversion may be induced by modification of a surface on which the precursor composition is deposited. For example, the surface energy may be modified to induce the phase inversion (e.g., by photoisomerization of a surface coating, or other surface modification). In some examples, the nanovoided polymer element of a device may include traces of a salt and/or surfactant used to induce and/or stabilize a phase of the precursor composition used in fabrication. These traces may have little effect on the device function or may in some examples facilitate use. For example, a nanovoided polymer element used as a component of a solid or multi-phase electrolyte component (such as an electron conductor in a battery or an ion conductor in a fuel cell, or as a separator in any electrochemical device) may advantageously include ions, such as salt ions. In some examples, the nanovoided polymer may include voids having surfactant molecules located around the interior surfaces of the nanovoids. In some examples, a nanovoided polymer element may include a polymer matrix including an arrangement of nanovoids, a surfactant (which may be located within the polymer matrix and/or as a coating of the interior surfaces of nanovoids), and one or more salt species.

Example devices, for example, devices that may be fabricated using a process including a phase inversion in a precursor layer, include electroactive devices having an electroactive nanovoided polymer layer. An electroactive element may include other materials (e.g., as layers) such as a polymer (e.g., a non-voided polymer), a metal (such as a transition metal, or other metal such as aluminum), an inorganic material such as an oxide (e.g., a metal oxide or non-metal oxide such as silica), or particles (such as microparticles, nanoparticles, or a solution or emulsion of nanoparticles). An electroactive element may include one or more thermoset materials. The electroactive element may have an elastic modulus of less than or approximately equal to 10 GPa, and in some examples less than or approximately equal to 1 GPa, for example, less than or approximately equal to 0.5 GPa.

Fabrication of an electroactive element may include one or more of the following deposition processes: spin coating, printing such as inkjet printing, vapor deposition such as chemical vapor deposition, vapor coating, thermal spraying, lamination, transfer of separately formed material layers formed by any deposition process (such as those mentioned herein), any other deposition process, or any combination thereof. In a transfer process, a polymer may be coated on a separate substrate surface, and subsequently picked up and placed on another layer, such as an electrode or an NVP layer. Fabrication of a device may include treatment with plasma, gas, or coating with a thin film of a high surfactant material, for example, as a surface pretreatment before deposition of another layer or material on the surface. An electroactive element may include one or more polymers such as: polysiloxanes (such as poly(alkyl siloxanes) such as poly(dimethyl siloxane) and derivatives thereof), acrylic polymers (such as polymethylmethacrylate, and such as free radical initiated polyacrylates), silicone-based polymer (such as polydimethylsiloxane), or any other silicone polymer, where silicone polymers may be polymerized using a hydrosilylation catalyst.

Devices may include one or more electrodes, which may include, for example, at least one thin, optionally flexible, electrically conductive layer. Devices may include one or more nanovoided polymer layers. A voided polymer is a polymer material including voids. In nanovoided polymers, the voids may have a typical diameter or similar dimension of less than approximately 1 micron, for example, a diameter or similar dimension of between approximately 10 nm and approximately 500 nm, for example, between approximately 50 nm and approximately 200 nm. The voids may be closed cell (in which voids may be isolated and may be enclosed by polymer), or open cell (in which voids are generally connected to each other). Voids may be filled with a gas, such as air, nitrogen, an inert gas, a dielectric gas (e.g., to increase mean permittivity, e.g., sulfur hexafluoride), or other gas. In some examples, voids may be liquid filled, for example, by a non-polymeric material. In some examples, a nanovoided polymer is fabricated with liquid in the voids, then some or all of the liquid is removed leaving at least partially gas-filled voids.

Examples include new functional materials including an NVP. The nanovoids in the polymer layer may provide an added degree of tunability in terms of overall macroscopic properties, such as one or more of electrical, mechanical, thermal, diffusive, or chemical properties. The peak of the nanovoid size distribution may be tuned by adjusting one or more parameters such as: temperature, pressure, component fractions of the precursor composition, or other parameters. In some examples, a parameter gradient (such as a temperature gradient during phase inversion) may be used to obtain a corresponding spatial gradient in one or more of the fabricated NVP element properties (e.g., degree of actuation for a particular applied voltage).

In some examples, a device including a stack of thinner layers of bulk polymer (non-voided polymer) and an NVP can improve the dielectric breakdown performance of the device. NVP layers may be fabricated according to processes described herein. Comparing a bulk polymer with a nanovoided polymer of the same material, the bulk polymer may show higher permittivity, because of higher polymer content, but also a lower dielectric breakdown. A multilayer structure having alternating layers of non-voided (bulk) polymer and nanovoided polymer allows increased permittivity (relative to an NVP) while also increasing the dielectric breakdown strength (relative to a non-voided polymer). During dielectric breakdown of a single non-voided dielectric polymer layer, an avalanche of electrons may travel through the polymer in a tree-like fashion, starting at one electrode, and once reaching the other electrode, the dielectric polymer is electrically shorted. An NVP layer can act as a barrier for electrical breakdown, as the mean free path of electrons in an NVP is so short that electrons cannot gain sufficient energy from the applied field. The introduction of the NVP layer may increase the voltage that can be applied to the device before dielectric breakdown occurs, for example, by reducing the mean free path of electrons and electron discharge path lengths.

In some examples, a device may include an NVP layer alternating with one or more layers of a better insulating, inorganic material layer to improve the dielectric breakdown performance of the NVP. Alternating layers of inorganic insulating material and NVP layers can reduce dielectric breakdown, and increase the voltage that can be applied to the device before dielectric breakdown occurs. NVP layers may be fabricated according to processes described herein, and inorganic materials may be deposited using any appropriate deposition technique.

In some examples, the foam-like structure of an NVP can be used as a sound absorption layer where the amount of sound absorption and sound reflection can be engineered through control of the NVP characteristics. The NVP layer can suppress the penetration of acoustical signals. Example processes described herein allow relatively monodisperse void sizes to be obtained, allowing predictable acoustic properties (e.g., resonance and absorption frequencies) to be determined.

In some examples, an NVP fabricated according to processes described herein may be used as a synthetic inverse opal structure, for example, having optical reflectance bands that may be highly sensitive to ambient conditions (e.g., temperature, pressure, mechanical input (e.g., pressure, acoustic waves), presence of contaminants, and the like).

In some examples, example processes may be used to obtain other phases, such as structures similar to lamellar phases, to obtain layered structures. Layered structures may have useful electroactive, electrical, and/or optical properties. In some examples, a non-polymerizable liquid may form tubular micelle like structures in a polymerizable liquid mixture, allowing fabrication of nanovoided polymer elements including tubular voids. Such nanovoided polymer elements may support fluid flow therethrough, for example, for use in heating or cooling devices. Tubular voids may also facilitate gas ejection and compression of actuators including an electroactive element including such an open pore structure.

In some examples, a nanovoided polymer may be further processed to form a nanovoided inorganic (or organic-inorganic) matrix. For example, silicon-containing polymers may be further processed to form nanovoided glasses, silica, or ormosils.

In some examples, an NVP may be used to improve the mechanical stability of a thin film device such as a MEMS device. A thin film device may include a multilayer structure, for example, including a nanovoided polymer layer and, for example, an inorganic solid layer such as a silicon layer. Usually, there is a tradeoff between total weight and structural rigidity of MEMS devices. By sandwiching a layer of NVP in between two layers of MEMS, an effectively thicker MEMS device with similar rigidity than a single MEMS of same thickness, but lower weight, can be created. The improved uniformity of voids formed by a phase inversion technique may be used to obtain improved (or more predictable) resonance or other mechanical properties of a MEMS device, compared to a NVP with a highly polydisperse void size distribution. In some examples, a MEMS device may include (or control) an optical element such as a lens or mirror. In some examples, a device may include an optical switch, a digital light processing device, a digital micromirror, or beam steering device. For example, a mirror may be supported on an adjustable support layer. The mirror may include a metal, such as aluminum. The support layer may include an NVP layer fabricated using a phase inversion process. The multilayer structure may include an inorganic layer/NVP layer combination, a non-voided polymer/NVP layer combination, a three-layer structure with either the inorganic layer, non-voided polymer, or the NVP as the middle layer of the three, or a larger multilayer structure including such examples therein. A MEMS device may include a silicon/NVP layer structure, or a silicon/porous silicon layer structure, for example, to reduce weight, improve actuation, improve device speed, and the like.

After fabricating an NVP using a technique such as described herein, an actuator element (e.g., including of one or more polymer-based layers) can be fabricated by a process such as co-extrusion or layer-by-layer deposition. In some examples, subsequent stretching or other mechanical deformation may be used to obtain highly uniform anisotropic voids, such as non-spherical voids such as oblate and prolate void shapes.

An NVP may include one or more polymers such as acrylates, halogenated polymers (such as fluoropolymers including polyvinylidene fluoride (PVDF), and copolymers of PVDF including PVDF:TrFE), other polymers, or blends or derivatives thereof. Example polymers may include nanoparticles to increase the dielectric constant of the polymer composite (e.g., relative to the bulk polymer). Nanoparticles may include a titanate (such as barium titanate, barium strontium titanate $BaSrTiO_3$, or $PbLaZrTiO_3$), an oxide (such as $TiO_2$, $CeO_2$, $Al_2O_3$, $Ta_2O_3$, $SiO_2$, or other metal or non-metal oxide), compounds such as $PbMgNbO_3+PbTiO_3$, or other inorganic nanoparticles. Mixtures of curable monomers with cured polymers may also be used. Stabilizers may also be used to prevent degradation from the environment. Example stabilizers include antioxidants, as well as light and heat stabilizers. In some examples, a nanovoided polymer element includes shaped voids (such as spherical or non-spherical voids) in a polymeric matrix. Example applications include nanovoided polymer devices, such as actuators, sensors, and optical elements.

In some examples, a device, such as a polymer actuator, includes nanovoids having spherical shapes. in some examples, the voids may have generally non-spherical shapes. The nanovoid shapes may be configured to suppress buckling in the material and allow the material to be greatly compressed from its original shape in a controllable manner. The nanovoids may be gas filed, for example, air-filled.

Examples include polymer devices, such as a polymer actuator. An example actuator includes a long thin block of material, which may include one or more layers. A polymer actuator may compress in response to an applied electrical field. The degree of compression may be controlled by controlling the magnitude (e.g., a root mean square (r.m.s.) value) or the applied electric field. The actuator may take on a desired configuration and may exert a force on an adjacent surface. In some examples, the actuator may be used to modify an optical element (e.g., adjust the focal length of a flexible lens), or provide haptic feedback.

In example applications, several polymer actuators can be positioned along the rim of a pair of glasses including a flexible lens, such as a fluid-filled lens, such as a lens including a liquid. An electric field can be used to move the actuators so that they exert a force on the lens, and change the focal point of the lens. Actuators may be configured to move an adjacent surface, for example, by distances up to 1 cm. The electrode separation may be of millimeter or sub-millimeter order to maintain reasonable voltage requirements for the actuator (e.g., less than 1 kV).

An actuator in compression may expand laterally, unless the actuator is laterally constrained, for example, by sidewalls. If the electroactive element of the actuator is constrained so that it cannot expand laterally, the force required to compress a solid electroactive element may be high, particularly if the electroactive element polymer material is close to incompressible. An NVP material includes many small pockets of air (nanovoids). An NVP is useful as an electroactive element, as it takes less force to compress the NVP than a similarly sized solid polymer element. In some examples, compression of air in the voids requires one or more orders of magnitude less force than that required to compress a solid block of material. Further, the components of air (e.g., nitrogen, oxygen) may dissolve in the polymer under compression, further facilitating compression of the NVP.

In some examples, an actuator has one or more of the following properties. An actuator may have a predictable and repeatable actuation response to a specified level of electric voltage. For example, the voltage-actuation response may be generally independent of the actuation history (e.g., whether actuation is increasing or decreasing). The actuation mechanism may survive many cycles of extending and retracting. The actuator response time may be sufficiently fast. This depends on applications, but example actuators may have a response time of less than 1 second, for example, from zero to maximum actuation, and in some examples the response time may be less than 100 msec. Some example actuators can achieve a maximum bulk compression of 50% or more.

Actuation may be measured as a bulk compression, or compression of a portion of, for example, an NVP element. Compression may be measured in absolute units (e.g., a length unit) or as a fraction, for example, the fraction of the deformation relative to an original undeformed dimension of the actuator. For example, if the actuator is compressed and the thickness after compression is 70% of the original uncompressed thickness, then the bulk compression may be expressed as 30%.

Nanovoids may include a hole (void) in an otherwise solid polymer that is filled, for example, with air or an inert gas such as nitrogen. A nanovoid may have a diameter or other analogous dimension less than approximately 1 micron, for example, in the range of approximately 1 nanometer to approximately 1 micrometer. The void fraction is the fraction of volume of the actuator (when in its original state with 0% bulk compression) occupied by voids, for example, by air or an inert gas. In some examples, voids may be at least partially filled with a liquid, such as a non-polymerizable liquid.

Example devices include an electroactive device, such as an actuator, having a multilayer electroactive element. For actuator use, an electrical voltage may be applied between two electrodes, where at least a part the NVP element is located between the two electrodes.

In some examples, a device may include an actuator, for example, having electrically-controllable compression, curvature, pressure on skin, texture, vibration, or other haptic function. Devices may be stacked to increase actuation. Example devices may be used to control optical elements, such as focal length or positional adjustments of lenses, mirrors, or other optical elements. Applications include improved autofocus and adaptive optics applications, such as in imaging devices. Applications also include wave-front correction of optical or other electromagnetic fields, for example, in projection systems. Examples include fine control actuators that can be combined with a coarser control actuator for extended actuation range. In some examples, actuators may be stacked to obtain enhanced actuation range.

Example devices also include sensors responsive to, for example, pressure (e.g., touch, acoustic signals), temperature, and the like. A sensor circuit may determine the magnitude of a mechanical input from a capacitance changes. Example device structures described herein may also provide improved capacitance-deformation curves and improved sensor accuracy. Devices, such as sensors and actuators, may be curved, flexible, or otherwise conformal to an underlying substrate.

Example devices may include optical elements, such as gratings, holographic elements, lenses, mirrors, and the like. Electrodes may be transmissive or reflective. A device with reflective or transmissive electrodes may be an electrically-controllable optical element. In some examples, electrodes may be stretchable, allowing bending. An example device may function both as an actuator and a touch sensor, and may also be reflective and/or optically transparent. Examples also include actuators configured to control a flexible lens (e.g., a liquid lens), flexible mirror, grating, prism, fiber, holographic element, or other optical element.

An electroactive device may include any device that either converts electrical energy to mechanical energy, or the reverse, or both, such as a sensor and/or an actuator. Electroactive devices may be used as haptic devices, optical elements, and other applications.

A nanovoided polymer may include a polymer material having voids therein. The voids may have a typical dimension of between approximately 10 and approximately 500 nm, such as between approximately 50 and approximately 200 nm. The voids may be closed cell (in which gas phase regions are isolated and surrounded by polymer) or open cell (in which gas phase regions are connected to each other).

Polymer layers used in a multilayer electroactive element may include one or more of: acrylates, halogenated polymers such as fluoropolymers including polyvinylidene difluoride (PVDF, polytetrafluoroethylene), copolymers of PVDF including PVDF:TrFE (poly(vinylidene fluoride-trifluoroethylene)), other fluorinated polyethylenes, other fluorinated polymers, other polymers, or blends or derivatives thereof.

In some examples, a polymer may include particles, such as nanoparticles, to increase the dielectric constant, such as inorganic particles. Inorganic particles may include one or more of the following particle compositions, titanates (including barium titanate or barium strontium titanate (BaSrTiO$_3$)), oxides (such as titanium dioxide (TiO$_2$), tantalum oxide (Ta$_2$O$_3$), aluminum oxide (Al$_2$O$_3$), or cerium oxide (CeO$_2$), metal oxides such as other transition metal oxides, other non-metal oxides, or other compounds such as PbLaZrTiO$_3$, PbMgNbO$_3$+PbTiO$_3$), metal particles, glass particles, nitride particles, semiconductor particles, other particles, or a combination thereof. Particles may include microparticles or nanoparticles. In some examples, a nanovoided polymer element may include polymer nanocomposites having particles embedded in the polymer. In some examples, a polymer may include embedded metal nanoparticles. In some examples, a precursor composition may include both a polymerizable material (e.g., may include one or more monomers) and one or more polymer species, for example, as a mixture.

In some examples, a spatially addressable electroactive device includes: a multilayer electroactive element including at least one NVP layer, the multilayer electroactive element having a first and second surface; a first electrode supported by the first surface, and a second electrode supported by the second surface. Example devices include a spatially addressable electroactive device such as an actuator, an optical element such as a transmissive or reflective optical element, or a sensor. A controller may be configured to apply electrical signals to a plurality of electrodes of an electroactive device, for example, to obtain a desired surface deformation of an actuator and, in some examples, of an optical element including an actuator, such as a lens or mirror.

In some examples, electrodes may be elastic, and may be stretchable. In some example devices, an electrode may be deposited on a substrate, which may be a flexible and/or stretchable substrate. In some example devices, an NVP may support a plurality of electrodes (e.g., including the first electrode in examples above), and the second electrode may be a common electrode, such as a ground. In some examples, electrodes may include an array of electrical conductors of a pre-defined shape arranged in a pre-defined pattern.

In some examples, an electroactive device may be spatially addressable, and provide the ability to apply and/or read different signals at different spatial locations on the device. In some examples, multiplexing schemes can be used to apply electrical signals. In some examples, electrode pairs may be provided by the intersection of electrode stripes on each side of the NVP, for example, between orthogonal electrode stripes.

Example devices may be used in a range of applications. For example, a spatially addressed nanovoided polymer can be locally actuated. Actuation may be controlled by the size and arrangement of the electrodes at that location and the amount of voltage applied at those electrodes. Example devices can be used as an optical element, a touch sensor, a thermal sensor, a pressure sensor, or a haptic element in a wearable device.

A device or system may further include a control circuit, the control circuit being configured to apply an electrical potential between the first electrode and the second electrode. A control circuit may be further configured to determine a physical deformation between the first electrode and the second electrode, for example, based on a capacitance determination. A device may be generally transparent, for example, including nanovoided polymer that is generally transparent, and transparent electrodes (e.g., transparent conductive oxide electrodes such as tin oxide, indium tin oxide, and the like). A first electrode (and/or a second electrode) may be generally transparent, or in some examples may be generally reflective. A device may be flexible, and in some examples transparent and flexible.

A device may include a spatially addressable actuator. Application of an electrical signal between the first electrode and the second electrode, and/or between other electrodes of the device, may induce a two-dimensional and/or three-dimensional conformational change of the nanovoided polymer element.

In some examples, the device is an electrically controllable optical element, which may include one or more of a mirror, a lens, a prism, a grating, a phase plate, a diffuser, a holographic element, a beam splitter, a beam combiner, or an optical filter. In some examples, the device may include a sensor, such as a touch sensor. An actuator may be controlled by an electrical potential between the first electrode and the second electrode, and a sensor responsive to a capacitance between the first electrode and the second electrode may be used to determine a degree of actuation (such as a displacement, relative displacement, or other deformation parameter).

Example methods of making a nanovoided polymer include depositing a mixture including a monomer, a liquid, optionally a surfactant, and optionally additional non-surfactant components. A deposited mixture may have monomer-containing droplets in an immiscible liquid mixture. Phase inversion may be used to obtain droplets of the immiscible liquid, in a liquid mixture including the monomer. A nanovoided polymer may be obtained from polymerization of the monomer-containing liquid mixture. After polymerization, remaining liquid components may be removed to give a nanovoided polymer with gas (e.g., air) filled voids. Phase inversion may be induced by, for example, changing temperature, addition of one or more chemical species (such as one or more salts), and/or changing the volume fraction of a component. Deposition may include one or more of vapor deposition, spin coating, inkjet printing, extrusion, thermal spraying, or lamination. Polymers may include acrylate (also referred to as acrylic), or siloxane (also referred to as silicone) polymers. Example deposition apparatus, for example, may include a rotating drum, moving surface, or other approach. In some examples, a rotating drum surface (or other surface used for deposition) may have a coating, for example, to facilitate one or more of the following; release of a deposited NVP element or precursor thereof, deposition and/or release of an electrode layer, formation or stabilization of a post-phase-inversion emulsion phase, or other aspect. Example nanovoided polymers may be used in electroactive devices such as actuators and sensors.

In some examples, a computer-implemented method includes application of electrical signals to a plurality of electrodes to obtain a desired surface deformation of an actuator, where the actuator includes an electroactive element fabricated according to processes described herein.

In some examples, a non-transitory computer-readable medium includes one or more computer-executable instructions that, when executed by at least one processor of a computing device, cause the computing device to control application of electrical signals to a plurality of electrodes to obtain a desired surface deformation of an actuator by application of electrical signals to electrodes, where the actuator includes an electroactive element fabricated according to processes described herein.

In some examples, signals of the same polarity may be applied to proximate electrodes to generate electrostatic repulsion and, for example, an increase in electrode separation.

In some examples, a computer-readable medium may include one or more computer-executable instructions that, when executed by at least one processor of a computing device, may cause the computing device to apply electrical signals to a plurality of electrodes of an electroactive device including an NVP element, to obtain a desired surface deformation of the electroactive device, where the electroactive device (such as an actuator) includes an electroactive element fabricated according to a process such as described herein.

In some examples, a method includes depositing a precursor composition onto a substrate, the precursor composition including droplets including a monomer, modifying the precursor composition to induce a phase inversion and thereby obtain droplets of a non-polymerizable liquid within a polymerizable liquid mixture, polymerizing the polymerizable liquid mixture to obtain a solid nanovoided polymer including droplets including the non-polymerizable liquid, and removing the non-polymerizable liquid to obtain a nanovoided polymer element. An example method may further include depositing a first electrode and a second electrode onto the nanovoided polymer element. An example method may further include fabricating a device including the nanovoided polymer element, for example, where the device is an actuator or a sensor. Depositing the precursor composition onto a substrate may include depositing the precursor layer using a deposition process including one or more of evaporation, spin coating, inkjet printing, non-inkjet printing, vapor deposition, vapor coating, thermal spraying, lamination, mist deposition, extrusion, or transfer of a separately formed material film. In some examples, the monomer includes an acrylate, an ether, an amide, an acrylamide, an amine, a vinyl, an epoxy, or an isocyanate.

In some examples, modifying the precursor composition to induce a phase inversion includes modifying an ambient condition of the precursor composition, where the ambient condition includes one or more of a temperature, incident radiation intensity, or external pressure. Modifying the precursor composition to induce a phase inversion may include modifying a component concentration in the precursor composition, and/or modifying a chemical composition of the precursor composition. Modifying a chemical composition of the precursor composition may include increasing a concentration of a salt in the precursor composition.

In some examples, polymerizing the polymerizable liquid mixture to obtain a solid nanovoided polymer may include inducing a chemical reaction between monomer molecules within the polymerizable liquid mixture, and/or exposing the polymerizable liquid mixture to electromagnetic radiation.

In some examples, removing the non-polymerizable liquid to obtain a nanovoided polymer element includes removing the non-polymerizable liquid using a reduced pressure, an increased temperature, or both.

A polymer element, or a device including a polymer element, may be fabricated using a process as described herein. The device may include one or more of an electroactive device such as an actuator, a sensor having an electroactive polymer element, or an electrically controllable optical element. An electrically controllable optical element may include one or more of a mirror, a lens, a prism, a grating, a phase plate, a diffuser, a holographic element, a beam splitter, a beam combiner, or an optical filter.

In some examples, a computer-implemented method includes applying an electrical signal between electrodes associated with nanovoided polymer-based device to obtain a desired electroactive response, such as a surface deformation of a nanovoided polymer element of the device.

In some examples, a system includes at least one physical processor, physical memory including computer-executable instructions that, when executed by the physical processor, cause the physical processor to apply an electrical signal to electrodes associated with a nanovoided polymer (NVP) element to obtain an actuation of the NVP element. A system may include a haptic device, and a desired surface deformation may be induced within the haptic device. A system may include an optical element, and the desired surface deformation may be induced on or within the optical element.

In some examples, a non-transitory computer-readable medium includes one or more computer-executable instructions that, when executed by at least one processor of a computing device, cause the computing device to apply an electrical signal between electrodes associated with a nanovoided polymer element based device, for example, to obtain a desired actuation of the device.

In some examples, an example device includes an electroactive element including a nanovoided polymer (NVP)

layer, a first electrode, and a second electrode. The electroactive layer may be located at least in part between the first electrode and the second electrode. The nanovoided polymer layer may be fabricated using a process including phase inversion. The device may be, for example, a spatially addressable electroactive device, such as an actuator or a sensor, and may include an optical element.

Embodiments may also include the following representative examples.

Example 1. A method includes depositing a precursor layer onto a substrate, the precursor layer including droplets including a polymerizable material, inducing a phase inversion in the precursor layer to obtain a modified precursor layer including droplets of a non-polymerizable liquid within a polymerizable liquid mixture including the polymerizable material, and polymerizing the polymerizable liquid mixture to obtain a nanovoided polymer element, where the nanovoided polymer element includes an electroactive polymer.

Example 2. The method of example 1, where the substrate includes a first electrode, and the method further includes forming a second electrode on the nanovoided polymer element so that nanovoided polymer element is located at least in part between the first electrode and the second electrode.

Example 3. The method of example 2, where the nanovoided polymer layer includes an electroactive polymer, and application of a potential difference between the first electrode and the second electrode induces an electroactive response in the nanovoided polymer element.

Example 4. The method of examples 1-3, where the polymerizable liquid mixture includes at least one monomer.

Example 5. The method of examples 1-4, where the at least one monomer includes at least one of an acrylate, an ether, an amide, an acrylamide, an amine, a vinyl, an epoxy, a siloxane, or an isocyanate.

Example 6. The method of examples 1-5, where polymerizing the polymerizable liquid mixture to obtain the nanovoided polymer element includes irradiation with UV or visible electromagnetic radiation.

Example 7. The method of examples 1-6, further including fabricating an electroactive device including the nanovoided polymer element, where the device is an actuator or a sensor.

Example 8. The method of examples 1-7, where depositing the precursor composition onto a substrate to form a precursor layer includes depositing the precursor composition onto the substrate using a deposition process, where the deposition process includes one or more of evaporation, spin coating, inkjet printing, non-inkjet printing, vapor deposition, vapor coating, thermal spraying, lamination, mist deposition, extrusion, or transfer of separately formed material films.

Example 9. The method of examples 1-8, where inducing a phase inversion in the precursor layer includes modifying a chemical composition of the precursor layer.

Example 10. The method of examples 1-9, where inducing a phase inversion in the precursor layer includes modifying a temperature of the precursor layer.

Example 11. The method of examples 1-10, further including removing at least a portion of the non-polymerizable liquid.

Example 12. The method of example 11, wherein removing the at least a portion of the non-polymerizable liquid includes using a reduced pressure, an increased temperature, or both.

Example 13. A method including depositing a precursor layer onto a substrate, the precursor layer including droplets including a polymerizable material, inducing a phase inversion in the precursor layer to obtain a modified precursor layer including droplets of a non-polymerizable liquid within a liquid mixture including the polymerizable material, and polymerizing the liquid mixture to obtain a nanovoided polymer element, where the nanovoided polymer element includes an electroactive polymer, the nanovoided polymer element includes a layer having a layer thickness of between 10 nm and 1 mm, for example, between 10 nm and 100 microns, for example, between 10 nm and 10 microns. and wherein the layer includes a plurality of nanovoids.

Example 14. The method of example 13, further including removing one or more liquids from the nanovoided polymer element after polymerizing the liquid mixture.

Example 15. The method of examples 13-14, where inducing a phase inversion in the precursor layer includes modifying a chemical composition or a temperature of the precursor layer.

Example 16. The method of examples 13-15, further including depositing a pair of electrodes on the nanovoided polymer element, so that at least a portion of the nanovoided polymer element is located between the pair of electrodes, and wherein the layer thickness may be between approximately 10 nm and approximately 100 microns.

Example 17. A method including depositing a first electrode, depositing a precursor layer onto the first electrode, the precursor layer including droplets including a polymerizable material and the droplets being located within a non-polymerizable liquid mixture, inducing a phase inversion in the precursor layer to obtain a phase-inverted precursor layer including droplets of a non-polymerizable liquid within a polymerizable liquid mixture, polymerizing the polymerizable liquid mixture to obtain a nanovoided polymer element, and depositing a second electrode onto the nanovoided polymer element, where the nanovoided polymer element includes an electroactive polymer including a plurality of nanovoids Example 18. The method of example 17, further including removing one or more liquids from the nanovoided polymer element after polymerizing the polymerizable liquid mixture.

Example 19. The method of example 17, where the method is performed by a deposition apparatus.

Example 20. The method of example 19, where depositing a precursor layer is performed by a vaporizer of the deposition apparatus.

Embodiments of the present disclosure may include or be implemented in conjunction with various types of artificial reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Embodiments of the present disclosure may include or be implemented in conjunction with various types of artificial reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 1100 in FIG. 11. Other artificial reality systems may include a NED that also provides visibility into the real world (e.g., augmented-reality system 1200 in FIG. 12) or that visually immerses a user in an artificial reality (e.g., virtual-reality system 1300 in FIG. 13). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
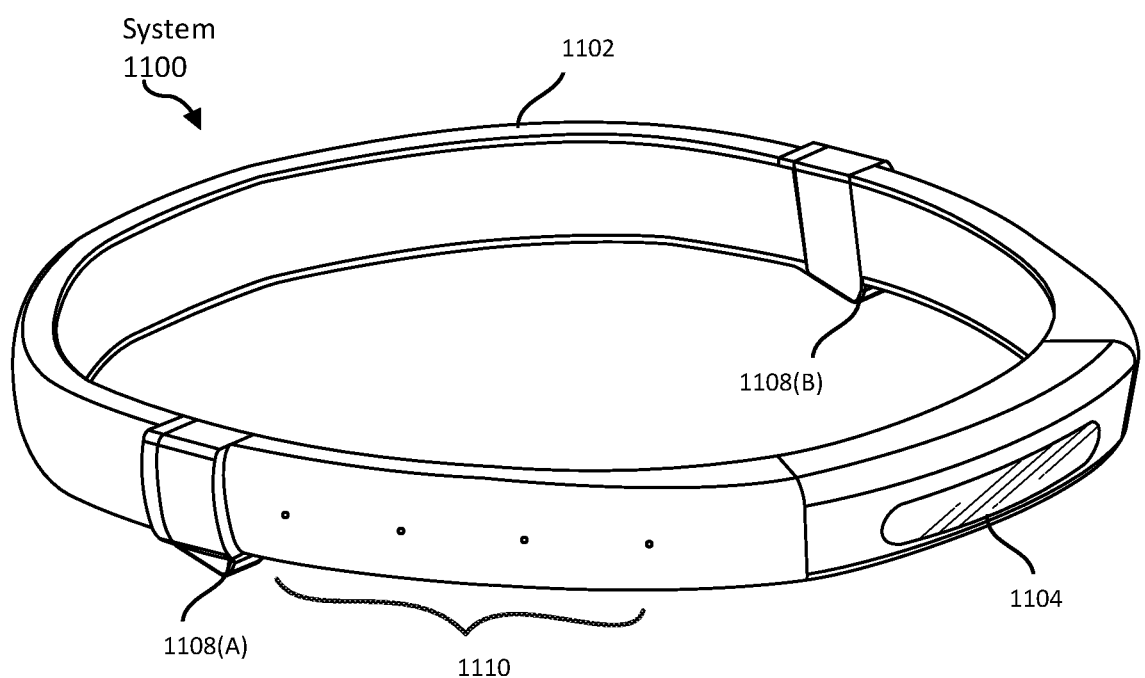
FIG. 11 is an illustration of an exemplary artificial-reality headband that may be used in connection with embodiments of this disclosure.

Turning to FIG. 11, augmented-reality system 1100 generally represents a wearable device dimensioned to fit about a body part (e.g., a head) of a user. As shown in FIG. 11, system 1100 may include a frame 1102 and a camera assembly 1104 that is coupled to frame 1102 and configured to gather information about a local environment by observing the local environment. Augmented-reality system 1100 may also include one or more audio devices, such as output audio transducers 1108(A) and 1108(B) and input audio transducers 1110. Output audio transducers 1108(A) and 1108(B) may provide audio feedback and/or content to a user, and input audio transducers 1110 may capture audio in a user's environment.

As shown, augmented-reality system 1100 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1100 may not include a NED, augmented-reality system 1100 may include other types of screens or visual feedback devices (e.g., a display screen integrated into a side of frame 1102).

Figure 12:
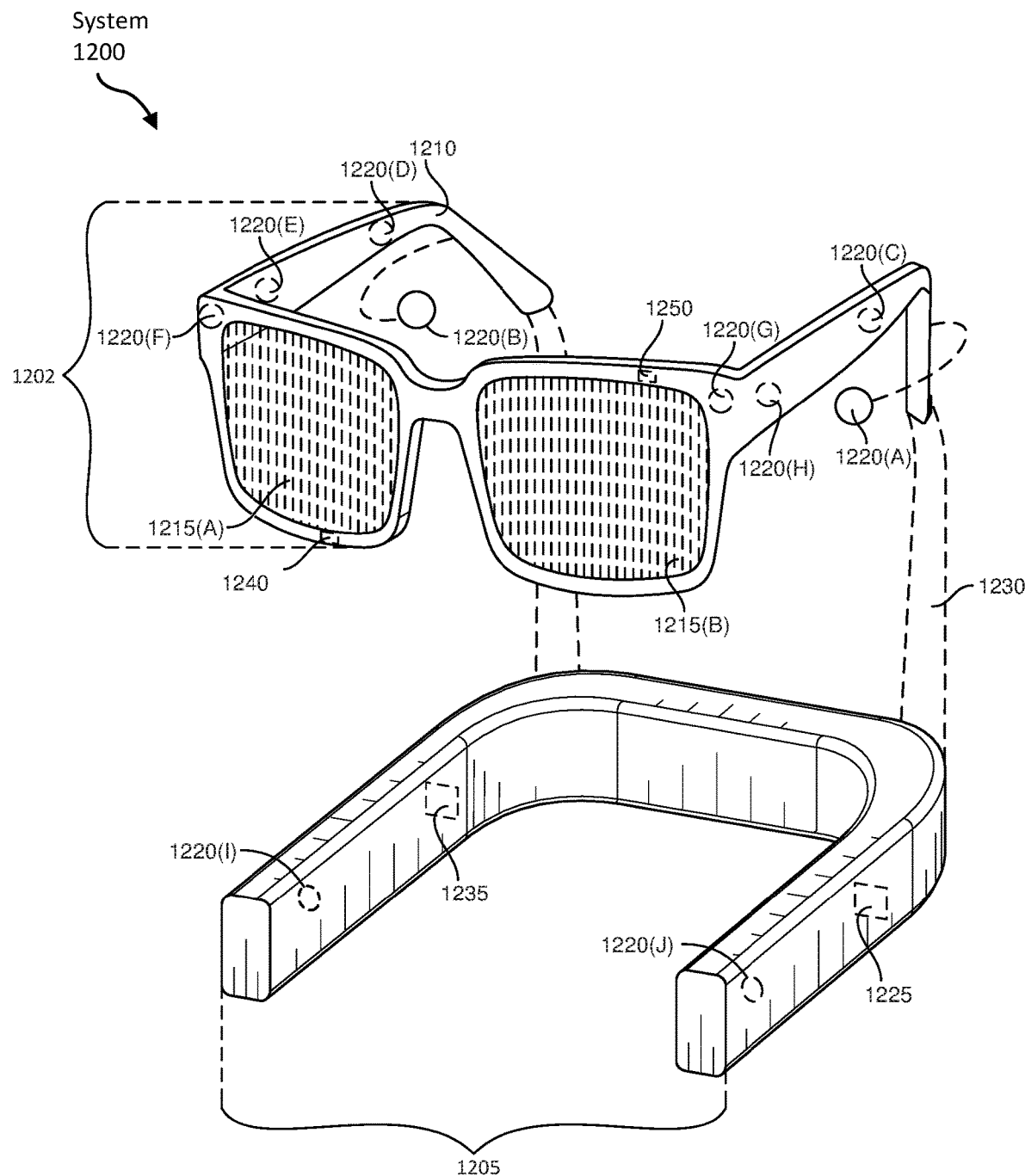
FIG. 12 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 12, augmented-reality system 1200 may include an eyewear device 1202 with a frame 1210 configured to hold a left display device 1215(A) and a right display device 1215(B) in front of a user's eyes. Display devices 1215(A) and 1215(B) may act together or independently to present an image or series of images to a user. While augmented-reality system 1200 includes two displays, embodiments of this disclosure may be implemented in augmented-reality systems with a single NED or more than two NEDs.

In some embodiments, augmented-reality system 1200 may include one or more sensors, such as sensor 1240. Sensor 1240 may generate measurement signals in response to motion of augmented-reality system 1200 and may be located on substantially any portion of frame 1210. Sensor 1240 may represent a position sensor, an inertial measurement unit (IMU), a depth camera assembly, or any combination thereof. In some embodiments, augmented-reality system 1200 may or may not include sensor 1240 or may include more than one sensor. In embodiments in which sensor 1240 includes an IMU, the IMU may generate calibration data based on measurement signals from sensor 1240. Examples of sensor 1240 may include, without limitation, accelerometers, gyroscopes, magnetometers, other suitable types of sensors that detect motion, sensors used for error correction of the IMU, or some combination thereof.

Augmented-reality system 1200 may also include a microphone array with a plurality of acoustic transducers 1220(A)-1220(J), referred to collectively as acoustic transducers 1220. Acoustic transducers 1220 may be transducers that detect air pressure variations induced by sound waves. Each acoustic transducer 1220 may be configured to detect sound and convert the detected sound into an electronic format (e.g., an analog or digital format). The microphone array in FIG. 2 may include, for example, ten acoustic transducers: 1220(A) and 1220(B), which may be designed to be placed inside a corresponding ear of the user, acoustic transducers 1220(C), 1220(D), 1220(E), 1220(F), 1220(G), and 1220(H), which may be positioned at various locations on frame 1210, and/or acoustic transducers 1220(1) and 1220(J), which may be positioned on a corresponding neckband 1205.

In some embodiments, one or more of acoustic transducers 1220(A)-(F) may be used as output transducers (e.g., speakers). For example, acoustic transducers 1220(A) and/or 1220(B) may be earbuds or any other suitable type of headphone or speaker.

The configuration of acoustic transducers 1220 of the microphone array may vary. While augmented-reality system 1200 is shown in FIG. 12 as having ten acoustic transducers 1220, the number of acoustic transducers 1220 may be greater or less than ten. In some embodiments, using higher numbers of acoustic transducers 1220 may increase the amount of audio information collected and/or the sensitivity and accuracy of the audio information. In contrast, using a lower number of acoustic transducers 1220 may decrease the computing power required by the controller 1250 to process the collected audio information. In addition, the position of each acoustic transducer 1220 of the microphone array may vary. For example, the position of an acoustic transducer 1220 may include a defined position on the user, a defined coordinate on frame 1210, an orientation associated with each acoustic transducer, or some combination thereof.

Acoustic transducers 1220(A) and 1220(B) may be positioned on different parts of the user's ear, such as behind the pinna or within the auricle or fossa. Or, there may be additional acoustic transducers on or surrounding the ear in addition to acoustic transducers 1220 inside the ear canal. Having an acoustic transducer positioned next to an ear canal of a user may enable the microphone array to collect information on how sounds arrive at the ear canal. By positioning at least two of acoustic transducers 1220 on either side of a user's head (e.g., as binaural microphones), augmented-reality device 1200 may simulate binaural hearing and capture a 3D stereo sound field around about a user's head. In some embodiments, acoustic transducers 1220(A) and 1220(B) may be connected to augmented-reality system 1200 via a wired connection 1230, and in other embodiments, acoustic transducers 1220(A) and 1220(B) may be connected to augmented-reality system 1200 via a wireless connection (e.g., a Bluetooth connection). In still other embodiments, acoustic transducers 1220(A) and 1220(B) may not be used at all in conjunction with augmented-reality system 1200.

Acoustic transducers 1220 on frame 1210 may be positioned along the length of the temples, across the bridge, above or below display devices 1215(A) and 1215(B), or some combination thereof. Acoustic transducers 1220 may be oriented such that the microphone array is able to detect sounds in a wide range of directions surrounding the user wearing the augmented-reality system 1200. In some embodiments, an optimization process may be performed during manufacturing of augmented-reality system 1200 to determine relative positioning of each acoustic transducer 1220 in the microphone array.

In some examples, augmented-reality system 1200 may include or be connected to an external device (e.g., a paired device), such as neckband 1205. Neckband 1205 generally represents any type or form of paired device. Thus, the following discussion of neckband 1205 may also apply to various other paired devices, such as charging cases, smart watches, smart phones, wrist bands, other wearable devices, hand-held controllers, tablet computers, laptop computers and other external compute devices, etc.

As shown, neckband 1205 may be coupled to eyewear device 1202 via one or more connectors. The connectors may be wired or wireless and may include electrical and/or non-electrical (e.g., structural) components. In some cases, eyewear device 1202 and neckband 1205 may operate independently without any wired or wireless connection between them. While FIG. 12 illustrates the components of eyewear device 1202 and neckband 1205 in example locations on eyewear device 1202 and neckband 1205, the components may be located elsewhere and/or distributed differently on eyewear device 1202 and/or neckband 1205. In some embodiments, the components of eyewear device 1202 and neckband 1205 may be located on one or more additional peripheral devices paired with eyewear device 1202, neckband 1205, or some combination thereof. Furthermore, Pairing external devices, such as neckband 1205, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1200 may be provided by a paired device or shared between a paired device and an eyewear device, thus reducing the weight, heat profile, and form factor of the eyewear device overall while still retaining desired functionality. For example, neckband 1205 may allow components that would otherwise be included on an eyewear device to be included in neckband 1205 since users may tolerate a heavier weight load on their shoulders than they would tolerate on their heads. Neckband 1205 may also have a larger surface area over which to diffuse and disperse heat to the ambient environment. Thus, neckband 1205 may allow for greater battery and computation capacity than might otherwise have been possible on a stand-alone eyewear device. Since weight carried in neckband 1205 may be less invasive to a user than weight carried in eyewear device 1202, a user may tolerate wearing a lighter eyewear device and carrying or wearing the paired device for greater lengths of time than a user would tolerate wearing a heavy standalone eyewear device, thereby enabling users to more fully incorporate artificial reality environments into their day-to-day activities.

Neckband 1205 may be communicatively coupled with eyewear device 1202 and/or to other devices. These other devices may provide certain functions (e.g., tracking, localizing, depth mapping, processing, storage, etc.) to augmented-reality system 1200. In the embodiment of FIG. 12, neckband 1205 may include two acoustic transducers (e.g., 1220(I) and 1220(J)) that are part of the microphone array (or potentially form their own microphone subarray). Neckband 1205 may also include a controller 1225 and a power source 1235.

Acoustic transducers 1220(I) and 1220(J) of neckband 1205 may be configured to detect sound and convert the detected sound into an electronic format (analog or digital). In the embodiment of FIG. 12, acoustic transducers 1220(I) and 1220(J) may be positioned on neckband 1205, thereby increasing the distance between the neckband acoustic transducers 1220(I) and 1220(J) and other acoustic transducers 1220 positioned on eyewear device 1202. In some cases, increasing the distance between acoustic transducers 1220 of the microphone array may improve the accuracy of beamforming performed via the microphone array. For example, if a sound is detected by acoustic transducers 1220(C) and 1220(D) and the distance between acoustic transducers 1220(C) and 1220(D) is greater than, for example, the distance between acoustic transducers 1220(D) and 1220(E), the determined source location of the detected sound may be more accurate than if the sound had been detected by acoustic transducers 1220(D) and 1220(E).

Controller 1225 of neckband 1205 may process information generated by the sensors on 1205 and/or augmented-reality system 1200. For example, controller 1225 may process information from the microphone array that describes sounds detected by the microphone array. For each detected sound, controller 1225 may perform a direction-of-arrival (DOA) estimation to estimate a direction from which the detected sound arrived at the microphone array. As the microphone array detects sounds, controller 1225 may populate an audio data set with the information. In embodiments in which augmented-reality system 1200 includes an inertial measurement unit, controller 1225 may compute all inertial and spatial calculations from the IMU located on eyewear device 1202. A connector may convey information between augmented-reality system 1200 and neckband 1205 and between augmented-reality system 1200 and controller 1225. The information may be in the form of optical data, electrical data, wireless data, or any other transmittable data form. Moving the processing of information generated by augmented-reality system 1200 to neckband 1205 may reduce weight and heat in eyewear device 1202, making it more comfortable to the user.

Power source 1235 in neckband 1205 may provide power to eyewear device 1202 and/or to neckband 1205. Power source 1235 may include, without limitation, lithium ion batteries, lithium-polymer batteries, primary lithium batteries, alkaline batteries, or any other form of power storage. In some cases, power source 1235 may be a wired power source. Including power source 1235 on neckband 1205 instead of on eyewear device 1202 may help better distribute the weight and heat generated by power source 1235.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1300 in FIG. 13, that mostly or completely covers a user's field of view. Virtual-reality system 1300 may include a front rigid body 1302 and a band 1304 shaped to fit around a user's head. Virtual-reality system 1300 may also include output audio transducers 1306(A) and 1306(B). Furthermore, while not shown in FIG. 13, front rigid body 1302 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1300 and/or virtual-reality system 1300 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1200 and/or virtual-reality system 1300 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 1100, augmented-reality system 1200, and/or virtual-reality system 1300 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 11 and 13, output audio transducers 1108(A), 1108(B), 1306(A), and 1306(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1110 may include condenser microphones, dynamic microphones, ribbon microphones, and/or any other type or form of input transducer. In some embodiments, a single transducer may be used for both audio input and audio output.

Figure 13:
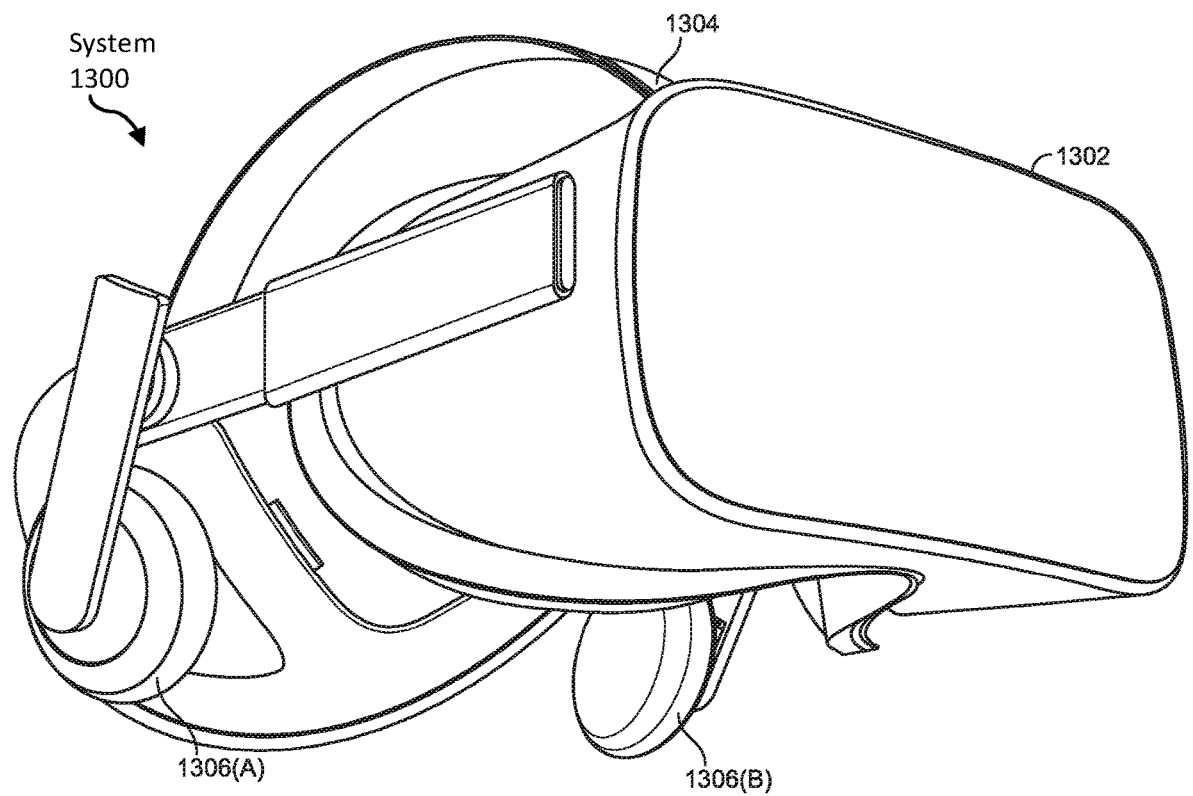
FIG. 13 is an illustration of an exemplary virtual-reality headset that may be used in connection with embodiments of this disclosure.

While not shown in FIGS. 11-13, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 100, 200, and 300 may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 14:
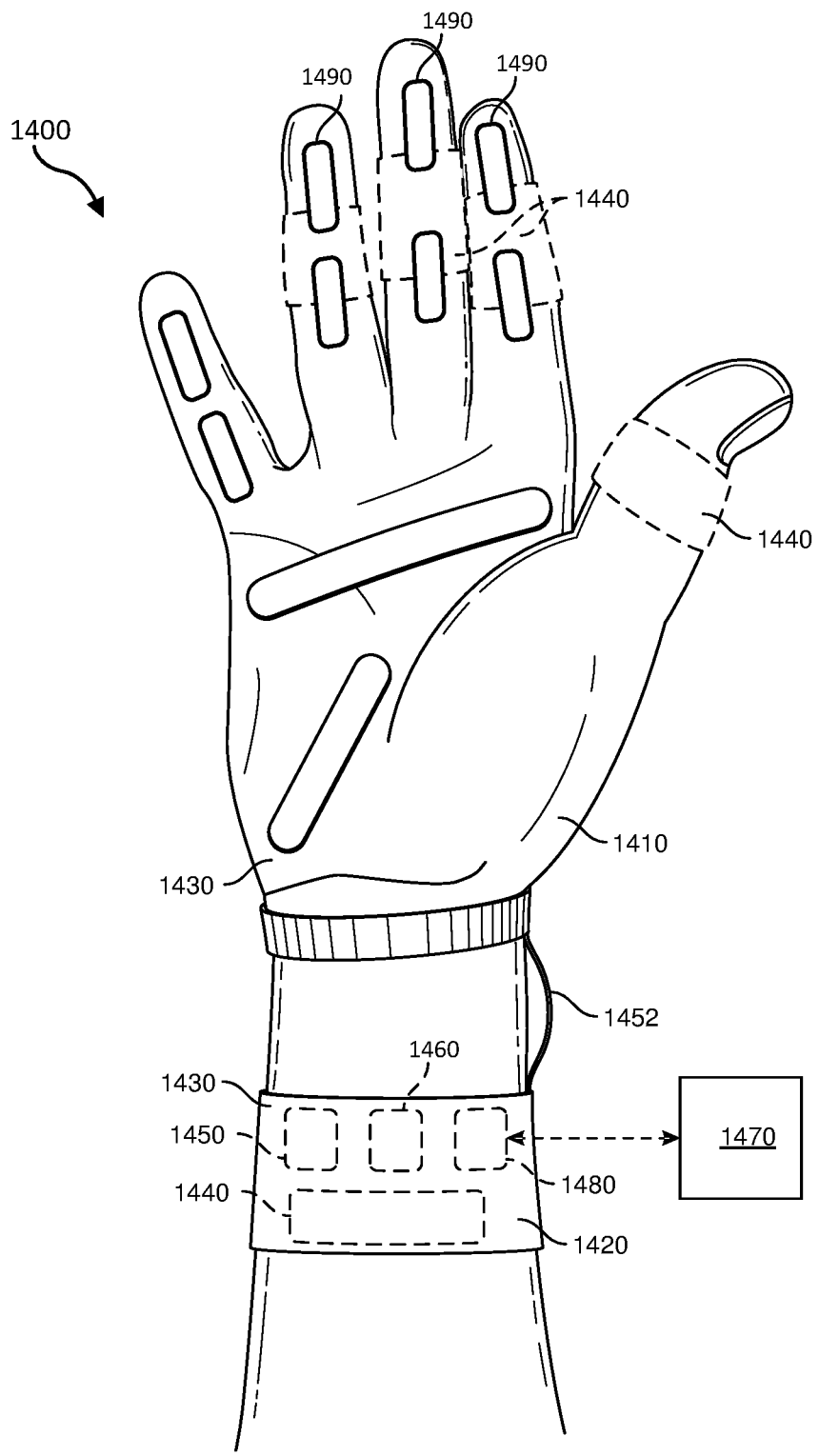
FIG. 14 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 14 illustrates a vibrotactile system 1400 in the form of a wearable glove (haptic device 1410) and wristband (haptic device 1420). Haptic device 1410 and haptic device 1420 are shown as examples of wearable devices that include a flexible, wearable textile material 1430 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1440 may be positioned at least partially within one or more corresponding pockets formed in textile material 1430 of vibrotactile system 1400. Vibrotactile devices 1440 may be positioned in locations to provide a vibrating sensation (e.g., haptic feedback) to a user of vibrotactile system 1400. For example, vibrotactile devices 1440 may be positioned to be against the user's finger(s), thumb, or wrist, as shown in FIG. 14. Vibrotactile devices 1440 may, in some examples, be sufficiently flexible to conform to or bend with the user's corresponding body part(s).

A power source 1450 (e.g., a battery) for applying a voltage to the vibrotactile devices 1440 for activation thereof may be electrically coupled to vibrotactile devices 1440, such as via conductive wiring 1452. In some examples, each of vibrotactile devices 1440 may be independently electrically coupled to power source 1450 for individual activation. In some embodiments, a processor 1460 may be operatively coupled to power source 1450 and configured (e.g., programmed) to control activation of vibrotactile devices 1440.

Vibrotactile system 1400 may be implemented in a variety of ways. In some examples, vibrotactile system 1400 may be a standalone system with integral subsystems and components for operation independent of other devices and systems. As another example, vibrotactile system 1400 may be configured for interaction with another device or system 1470. For example, vibrotactile system 1400 may, in some examples, include a communications interface 1480 for receiving and/or sending signals to the other device or system 1470. The other device or system 1470 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 1480 may enable communications between vibrotactile system 1400 and the other device or system 1470 via a wireless (e.g., Wi-Fi, Bluetooth, cellular, radio, etc.) link or a wired link. If present, communications interface 1480 may be in communication with processor 1460, such as to provide a signal to processor 1460 to activate or deactivate one or more of the vibrotactile devices 1440.

Vibrotactile system 1400 may optionally include other subsystems and components, such as touch-sensitive pads 1490, pressure sensors, motion sensors, position sensors, lighting elements, and/or user interface elements (e.g., an on/off button, a vibration control element, etc.). During use, vibrotactile devices 1440 may be configured to be activated for a variety of different reasons, such as in response to the user's interaction with user interface elements, a signal from the motion or position sensors, a signal from the touch-sensitive pads 1490, a signal from the pressure sensors, a signal from the other device or system 1470, etc.

Although power source 1450, processor 1460, and communications interface 1480 are illustrated in FIG. 14 as being positioned in haptic device 1420, the present disclosure is not so limited. For example, one or more of power source 1450, processor 1460, or communications interface 1480 may be positioned within haptic device 1410 or within another wearable textile.

Figure 15:
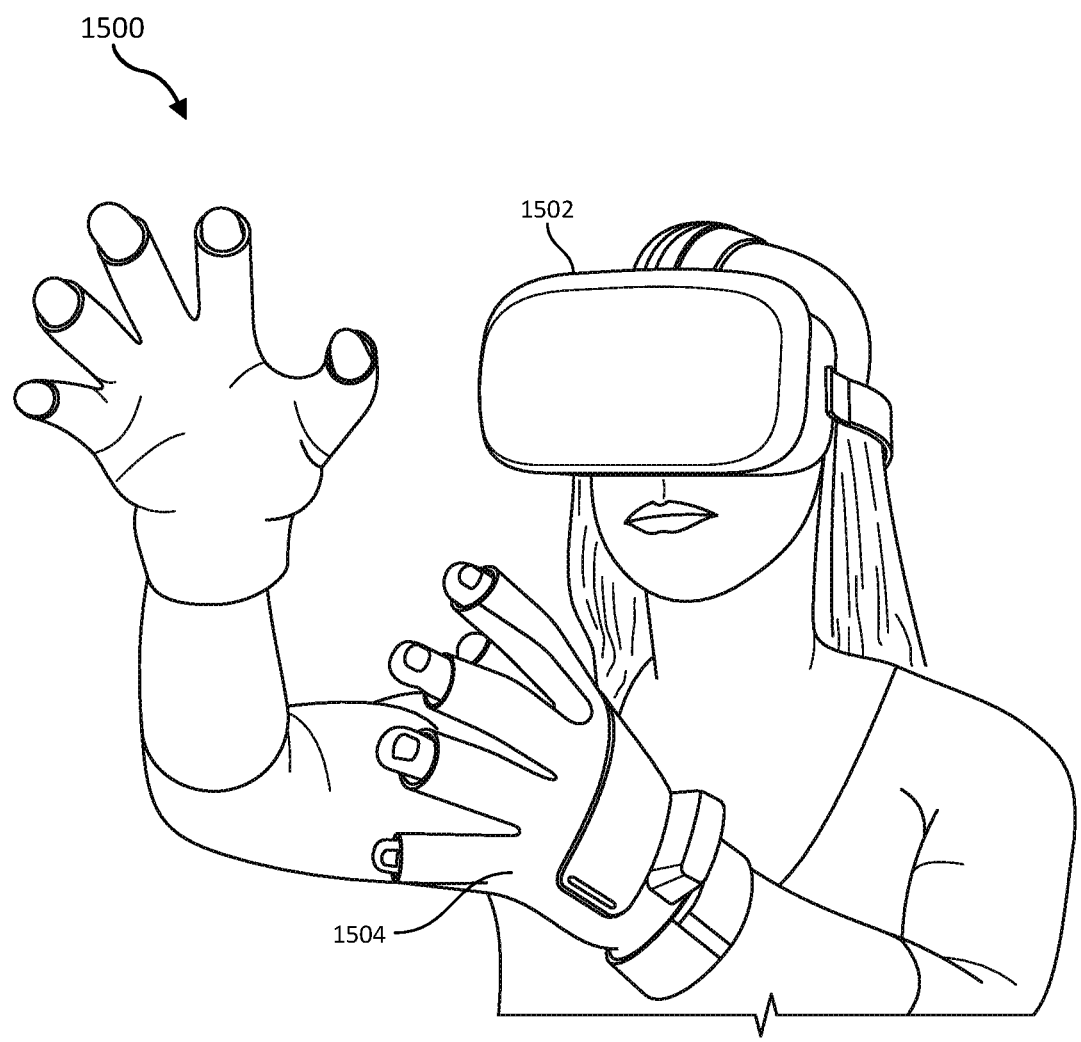
FIG. 15 is an illustration of an exemplary virtual-reality environment according to embodiments of this disclosure.

Haptic wearables, such as those shown in and described in connection with FIG. 14, may be implemented in a variety of types of artificial-reality systems and environments. FIG. 15 shows an example artificial reality environment 1500 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Head-mounted display 1502 generally represents any type or form of virtual-reality system, such as virtual-reality system 1300 in FIG. 13. Haptic device 1504 generally represents any type or form of wearable device, worn by a use of an artificial reality system, that provides haptic feedback to the user to give the user the perception that he or she is physically engaging with a virtual object. In some embodiments, haptic device 1504 may provide haptic feedback by applying vibration, motion, and/or force to the user. For example, haptic device 1504 may limit or augment a user's movement. To give a specific example, haptic device 1504 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 1504 to send action requests to a console. Examples of action requests include, without limitation, requests to start an application and/or end the application and/or requests to perform a particular action within the application.

Figure 16:
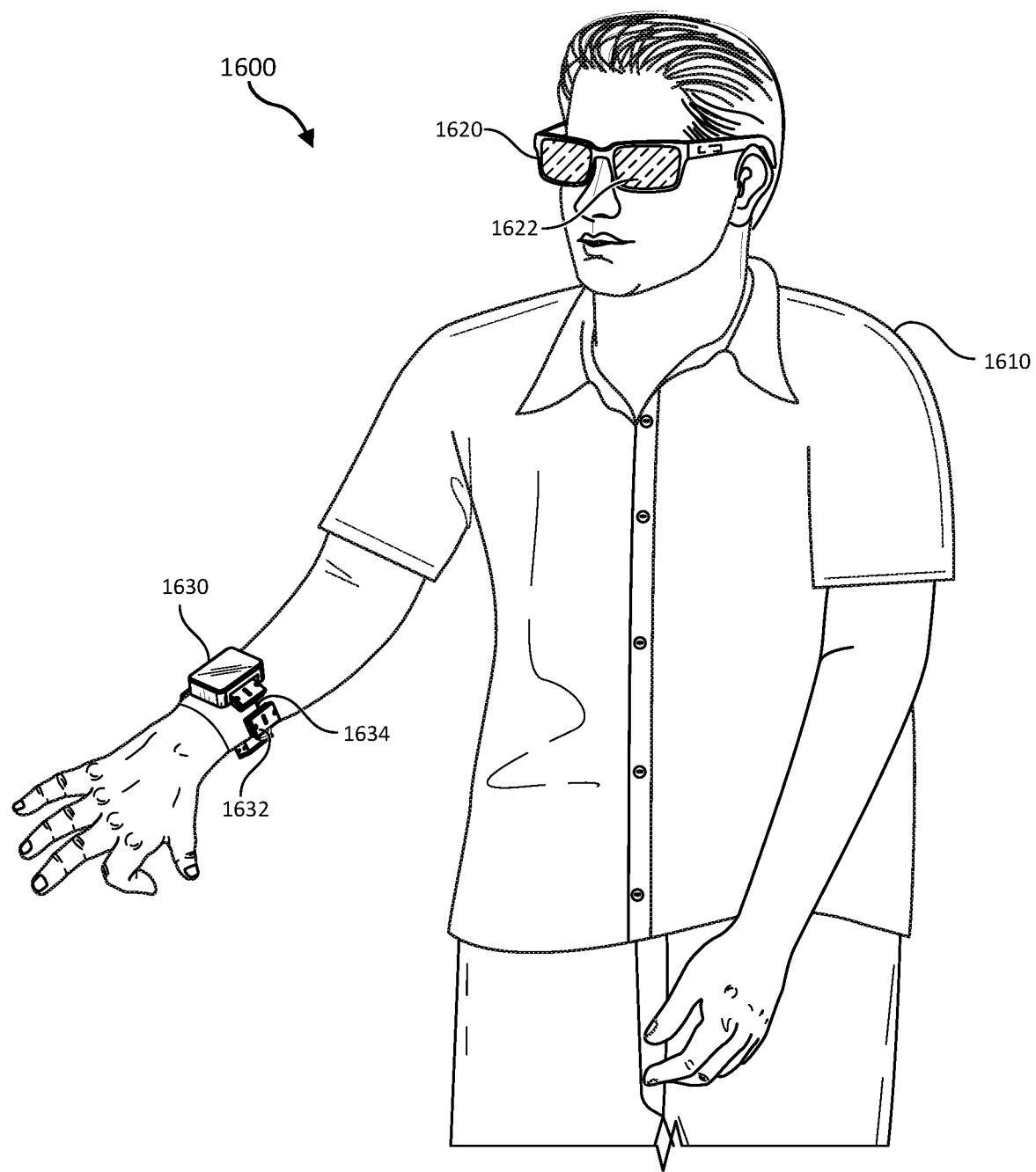
FIG. 16 is an illustration of an exemplary augmented-reality environment according to embodiments of this disclosure.

While haptic interfaces may be used with virtual-reality systems, as shown in FIG. 15, haptic interfaces may also be used with augmented-reality systems, as shown in FIG. 16. FIG. 16 is a perspective view a user 1610 interacting with an augmented-reality system 1600. In this example, user 1610 may wear a pair of augmented-reality glasses 1620 that have one or more displays 1622 and that are paired with a haptic device 1630. Haptic device 1630 may be a wristband that includes a plurality of band elements 1632 and a tensioning mechanism 1634 that connects band elements 1632 to one another.

One or more of band elements 1632 may include any type or form of actuator suitable for providing haptic feedback. For example, one or more of band elements 1632 may be configured to provide one or more of various types of cutaneous feedback, including vibration, force, traction, texture, and/or temperature. To provide such feedback, band elements 1632 may include one or more of various types of actuators. In one example, each of band elements 1632 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1410, 1420, 1504, and 1630 may include any suitable number and/or type of haptic transducer, sensor, and/or feedback mechanism. For example, haptic devices 1410, 1420, 1504, and 1630 may include one or more mechanical transducers, piezoelectric transducers, and/or fluidic transducers. Haptic devices 1410, 1420, 1504, and 1630 may also include various combinations of different types and forms of transducers that work together or independently to enhance a user's artificial-reality experience. In one example, each of band elements 1632 of haptic device 1630 may include a vibrotactor (e.g., a vibrotactile actuator) configured to vibrate in unison or independently to provide one or more of various types of haptic sensations to a user.

In some examples, a nanovoided polymer element may include a polymer having a plurality of nanovoids disposed therein. In some examples, the device may be located on a substrate, which may be a fabric substrate, such as a glove component, a polymer, a flexible substrate, or a rigid substrate. The nanovoided polymer element may be flexible, and may be conformed to an underlying non-planar substrate. The nanovoided polymer element may include one or more polymer components, such as an acrylate polymer or a silicone polymer.

In some examples, the nanovoided polymer may be generally transparent, the first plurality of electrodes may be generally transparent or generally reflective, and the second plurality of electrode may be generally transparent or generally reflective. The physical deformation of the nanovoided polymer element may induce a spatially varying refractive index of the nanovoided polymer element, for example, a refractive index that has a position-dependent value across the NVP element.

In some examples, the nanovoids may have a dimension, such as a diameter, of less than 1 micron, and in some examples the nanovoids may have a median nanovoid diameter (or analogous dimension) is in the range 10 nm-1 micron, for example, in the range 50 nm-200 nm. In some examples, a nanovoided polymer may include an electroactive polymer having a plurality of nanovoids. In some example applications, a device may include an electroactive polymer layer with or without nanovoids, for example, a polymer layer including microvoids or no voids.

In some examples, a device may include an electrically controllable optical element, for example, one or more of a mirror, a lens, a prism, a grating, a phase plate, a diffuser, a holographic element, a beam splitter, a beam combiner, or an optical filter. For example, application of a spatially (e.g., periodically) varying electric field may induce a spatially (e.g., periodically) varying parameter, such as a refractive index, surface displacement, or the like. For example, the optical element may include a mirror, and the physical deformation of the nanovoided polymer element may induce a spatially varying deformation of the mirror. The mirror may include a reflective film, such as a metal film, deposited onto the NVP element. A film may be both electrically conductive and reflective, and be used as both an electrode (or pattern or electrodes) and a mirror.

In some examples, a system includes at least one physical processor, and physical memory including computer-executable instructions that, when executed by the physical processor, cause the physical processor to apply electrical signals to one or more electrodes of an electroactive device including a nanovoided polymer element, to obtain a desired surface deformation of an electroactive device. The system may include a haptic device, and the desired surface deformation may be induced within the haptic device.

In some examples, a device may include an actuator controlled by an electrical potential between the first electrode and the second electrode, and a sensor responsive to, for example, a capacitance between the first electrode and the second electrode. In some examples, the optical element includes a mirror, and the physical deformation of the nanovoided polymer element induces a spatially varying deformation of the mirror. In some examples, a method, for example, performed by a device as described herein, may include applying electrical signals to a plurality of electrodes of an electroactive device including a nanovoided polymer element to obtain a surface deformation of the electroactive device.

In some applications, an electroactive device used in connection with the principles disclosed herein may include a first electrode, a second electrode, and an electroactive element disposed between the first electrode and the second electrode. The electroactive element may include an electroactive polymer and a plurality of voids distributed within the electroactive polymer, for example, as a porous polymer structure. Voids may be generally isolated from each other, or, at least in part, be interconnected through an open-cell structure. The plurality of voids may have a non-uniform distribution within the electroactive polymer, and the electroactive element may have a non-uniform electroactive response when an electrical signal is applied between the first electrode and the second electrode, based on the non-uniform distribution of voids.

A non-uniform distribution of the plurality of voids may include a spatial variation in at least one of void diameter, void volume, void number density, void volume fraction, or void orientation (e.g., in the case of anisotropic voids). Voids may include a non-polymeric material. Voids may include at least one of a gas, a liquid, a gel, a foam, or a non-polymeric solid. A non-uniform electroactive response may include a first deformation of a first portion of the electroactive element that differs from a second deformation of a second portion of the electroactive element. A deformation may include a compression (e.g., parallel to an applied electric field), change in curvature, or other change in a dimensional parameter, such as length, width, height, and the like, in one or more directions. An electroactive device may have a first deformation on application of a first voltage between the first and second electrodes, and a second deformation on application of a second voltage between the first and second electrodes, with the first and second deformations being appreciably different. An electrical signal may include a potential difference, which may include a direct or alternating voltage. The frequency of alternating voltage may be selected to provide an appreciable haptic sensation on the skin of a wearer. In some embodiments, the frequency may be higher than the highest mechanical response frequency of the device, so that deformation may occur in response to the applied r.m.s. electric field but with no appreciable oscillatory mechanical response to the applied frequency. The applied electrical signal may generate non-uniform constriction of the electroactive element between the first and second electrodes. A non-uniform electroactive response may include a curvature of a surface of the electroactive element, which may in some embodiments be a compound curvature.

In some embodiments, an electroactive device may include an optical element mechanically coupled to the electroactive element. An optical element may include at least one of a lens, a grating, a prism, a mirror, or a diffraction grating. In some embodiments, the electroactive device may be a component of a wearable device. The wearable device may include a helmet or other headwear, an eyewear frame, a glove, a belt, or any device configured to be positioned adjacent to or proximate the body of a wearer, for example, to support the electroactive device proximate a user when the user wears the wearable device, and the electroactive device may be configured to provide a tactile signal to the user. In some embodiments, an electroactive device includes a first electrode, a second electrode, and an electroactive element located between the first electrode and the second electrode. The electroactive element may include an electroactive polymer and a plurality of voids having a non-uniform distribution within the electroactive element. Application of a mechanical input to a portion of the electroactive element generates an electric signal between the first electrode and the second electrode. The electrical response to a mechanical variation may vary over the electroactive device, with the magnitude being determined, at least in part, by the location of the mechanical input relative to the non-uniform distribution of voids within the electroactive element. The electroactive element may include a first portion and a second portion, and a first voltage generated by a mechanical input to the first portion is appreciably different from a second voltage generated by a similar mechanical input to the second portion.

The electroactive device may be a component of a wearable device, configured to be worn by a user. The wearable device may be configured to support the electroactive device against a body portion of the user. The electroactive device may be configured to provide an electrical signal correlated with a configuration of the body part, such as a configuration of a body part, such as a joint angle. For example, the electrical signal may be used to determine a joint angle of a finger portion, wrist, elbow, knee, ankle, toe, or other body joint, or the bend angle of a mechanical device. For example, the wearable device may be a glove, and the electroactive device may be configured to provide an electrical signal based, at least in part, on a joint angle within a hand of the user, such as the angle between portions of a finger. In some embodiments, a method includes generating an electroactive response in an electroactive device, the electroactive device including an electroactive element located between a first electrode and a second electrode, where the electroactive is response to an electrical input or a mechanical input varies appreciably over a spatial extent of the electroactive device due to a non-uniform distribution of voids within the electroactive element.

In some embodiments, the electroactive response may include a mechanical response to the electrical input that varies over the spatial extent of the electroactive device, with the electrical input being applied between the first electrode and the second electrode. The mechanical response may be termed an actuation, and example devices may be or include actuators. In some embodiments, the electroactive response may include an electrical signal having a characteristic indicative of a location of the mechanical input to the electroactive device, the electrical signal being measured between the first electrode and the second electrode. The electrical signal may be a termed sensor signal, and in some embodiments, the electroactive device may be or include a sensor. In some embodiments, an electroactive device may be used as both an actuator and a sensor. In some embodiments, the electroactive device is supported against a hand of a user, and the electrical signal is used to determine a gesture by the user, the gesture including a finger movement. In some embodiments, typing inputs by a user, for example, into a virtual keyboard, may be determined from sensor signals.

In some embodiments, an electroactive device may include one or more electroactive elements, and an electroactive element may include one or more electroactive materials, which may include one or more electroactive polymer materials. In various embodiments, an electroactive device may include a first electrode, a second electrode overlapping at least a portion of the first electrode, and an electroactive element disposed between the first electrode and the second electrode. In some embodiments, the electroactive element may include an electroactive polymer. In some embodiments, an electroactive element may include an elastomer material, which may be a polymer elastomeric material. In some embodiments, the elastomer material may have a Poisson's ratio of approximately 0.35 or less. The electroactive element may be deformable from an initial state to a deformed state when a first voltage is applied between the first electrode and the second electrode, and may further be deformable to a second deformed state when a second voltage is applied between the first electrode and the second electrode.

In some embodiments, there may be one or more additional electrodes, and a common electrode may be electrically coupled to one or more of the additional electrodes. For example, electrodes and electroactive elements may be disposed in a stacked configuration, with a first common electrode coupled to a first plurality of electrodes, and a second common electrode electrically connected to a second electrode, which may be one of a second plurality of electrodes. The first and second pluralities may alternate in a stacked configuration, so that each electroactive element is located between one of the first plurality of electrodes and one of the second plurality of electrodes.

In some embodiments, an electroactive element may have a maximum thickness in an undeformed state and a compressed thickness in a deformed state. In some embodiments, an electroactive element may have a density in an undeformed state that is approximately 90% or less of a density of the electroactive element in the deformed state. In some embodiments, an electroactive element may exhibit a strain of at least approximately 10% when a voltage is applied between the first electrode and the second electrode.

In some embodiments, an electroactive element may include at least one non-polymeric component in a plurality of defined regions and the method may further include removing at least a portion of the at least one non-polymeric component from the cured elastomer material to form a nanovoided polymer material.

In some embodiments, an electroactive device may include an electroactive polymer configured with a first location of patterned nanovoids such that the first location has a different transduction behavior from a second location having a second location of patterned nanovoids. In some embodiments, a global electric field applied over the entirety of an electroactive element generates differential deformation between the first and second locations. An electroactive element may have a plurality of locations of patterned nanovoids such that when a first voltage is applied the EAP exhibits a predetermined compound curvature. The electroactive device may exhibit a second predetermined compound curvature, different from the first predetermined compound curvature, when a second voltage is applied. A wearable device may include an electroactive device, where the first compound curvature provides a first tactile feeling and the second compound curvature provides a second tactile feeling to a person when the person is wearing the wearable device. In some electrodes, the first electrode and/or the second electrode may be patterned, allowing a localized electric field to be applied to a portion of the device, for example, to provide a localized compound curvature.

In some embodiments, a sensor may include an electroactive device, where the electroactive device includes a first and a second portion, where the first portion has a different sensor response than the second portion due to a non-uniform distribution of patterned nanovoids. The sensor may be a wearable device. The sensor may be in electrical communication with a controller configured to determine a flexure of a wearable device based on the one or more electrical outputs from the wearable device. For example, the wearable device may include one or more electroactive devices configured as sensors. In some embodiments, a sensor may be configured to determine a joint position of a wearer of the sensor based on the one or more electrical signals from the sensor. The sensors may be part of a glove or other wearable device. In some embodiments, the sensor may include an arrangement of electroactive sensors and may be configured to determine keystrokes into a keyboard, where the keyboard may be a real or virtual keyboard.

A non-uniform distribution of voids within an electroactive element may include a functional dependence on a distance parameter, such as distance from an edge and/or center of an electroactive element. For example, an electroactive element may have a generally rectangular shape with a generally uniform thickness. In some embodiments, the volume fraction of voids may increase monotonically along a direction parallel to a longer side and/or a shorter side of the rectangular shape. In some examples, the void volume fraction may have a highest value in some portion of the electroactive element and decrease from the highest portion to portions with lower void volume fractions elsewhere, for example, proximate an edge. In some examples, the void volume fraction may have a lowest value in some portion of the electroactive element and increase from the lowest portion to portions with higher void volume fractions elsewhere, for example, proximate an edge of the electroactive element. In some examples, an electroactive element may have a generally disk shape. The volume fraction of voids may vary as a function of a radial distance from the disk center. In some embodiments, the volume fraction may be highest in a central portion of a disk-shaped electroactive element and decrease along a radial direction to an edge. In some embodiments, the volume fraction may be lowest in a central portion and increase along a radial direction to an edge. The variation in void volume fraction may have a functional relationship with a distance parameter, for example, including one or more of a linear, quadratic, sinusoidal, undulating, parabolic, or other functional relationship with a distance parameter along one or more of the relevant distance parameters. For example, a distance parameter may be determined as the distance along an edge, obliquely across, from a center, or other distance measurement for a given electroactive element.

An electroactive element can convert deformations into electrical signals, such as proportional electrical signals that scale with a deformation parameter (such as applied pressure). An electroactive element may also receive an electrical signal that induces a deformation based on the electrical signal (e.g., based on the voltage squared or mean square voltage). An electroactive device may be a transducer, with a degree of deformation based on the electrical signal, and/or as a sensor providing an electrical signal based on a degree of deformation. The electroactive response may be mediated by the dielectric constant and elastic modulus of the electroactive element. Using a single homogeneous polymer film constrains the transducer response to a particular input electrical signal/output mechanical response across the device. In some embodiments, an electroactive device actuates and/or senses deformations as a function of position within a single device, without the need for complex electrode structures, facilitating electroactive devices (such as transducers and/or sensors) capable of spatially variable actuation and sensing responses, using a simple electrical architecture such as a pair of electrodes.

In some embodiments, a device may include a transducer that converts variations in a physical quantity into an electrical signal, and/or vice versa. In some embodiments, the electrical response of a transducer may be correlated with a location of a mechanical input. The process by which variations in a physical quantity transforms into an electrical signal, and/or vice versa, may be referred to as transduction. A transducer may include an electroactive element, such an electroactive polymer element. In some examples, an electroactive element may include an electroactive polymer with a distribution of voids formed therein.

In some embodiments, an electroactive element may include a distribution of voids. In some embodiments, a void may include a region filled with a different medium, such as a non-polymeric material, such as a gas such as air, or a liquid. A portion of the electroactive element may have a volume fraction of voids, which may be determined as the void volume within a portion of the electroactive element divided by the total volume of the portion of the electroactive element. In some embodiments, the void volume fraction may be a function of a distance parameter. For example, the void volume fraction may be a linear function of a distance from one edge of an electroactive element, for example, increasing in a generally linear fashion from one side to another. In some examples, the volume void fraction may be a non-linear function of a distance parameter, such as a polynomial function (such as a quadratic function), a step function, a parabolic function, an undulating function, a sine function, or the like. A distance parameter may be a distance from an edge of an electroactive element. In some embodiments, an electroactive element may have a generally cuboid shape, for example, having a length, width, and thickness, for example, as determined along generally mutually orthogonal directions. The thickness of the electroactive element may be approximately equal to the electrode separation. In some embodiments, an electroactive element may have a disk shape, a wedge shape, an elongated form such as a rod, or other shape. A distance parameter may be (as appropriate) a distance along an edge (e.g., a distance from one side towards another side), a radial distance (e.g., a distance from a center or an edge of a disk-shaped form in a generally radial direction), or other distance measurement. In some embodiments, a volume void fraction may be a function of a distance parameter over a plurality of electroactive elements, for example, including a plurality of electroactive elements having different mean void volume fractions (optionally having an appreciable internal variation of void volume fraction, or in some embodiments no appreciable internal variation of void volume fraction) arranged to obtain a desired variation of void volume fraction with distance across a plurality of electroactive elements.

In some embodiments, a system may include at least one physical processor, a physical memory including computer-executable instructions that, when executed by the physical processor, cause the physical processor to apply an electrical field across an electroactive device to obtain non-uniform actuation based on a non-uniform distribution of voids within an electroactive element of the electroactive device. In some embodiments, a system may include at least one physical processor, a physical memory including computer-executable instructions that, when executed by the physical processor, cause the physical processor to receive an electrical signal from an electroactive device, and to process the electrical signal to obtain a deformation parameter of the electroactive device, where the deformation parameter includes one or more of the following: a magnitude of a deformation, a location of a deformation, a bend angle, a gesture type (e.g., selected from a plurality of gesture types). The analysis of the electrical signal may be based at least in part on a non-uniform distribution of voids within an electroactive element of the electroactive device.

In some embodiments, the electroactive elements described herein may include an elastomer having an effective Poisson's ratio of less than approximately 0.35 and an effective uncompressed density that is less than approximately 90% of the elastomer when densified. In some embodiments, the term "effective Poisson's ratio" may refer to the negative of the ratio of transverse strain (e.g., strain in a first direction) to axial strain (e.g., strain in a second direction) in a material. In some embodiments, the electroactive elements may include a nanovoided polymer material.

In the presence of an electrostatic field, an electroactive polymer may deform (e.g., compress, elongates, bend, etc.) according to the strength of that field. Generation of such a field may be accomplished, for example, by placing the electroactive polymer between two electrodes, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In some embodiments, a polymer element may include an elastomer. As used herein, an "elastomer" may (in some examples) refer to a material, such as a polymer, with viscoelasticity (i.e., both viscosity and elasticity), relatively weak intermolecular forces, and generally low elastic modulus (a measure of the stiffness of a solid material) and high failure strain compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, less than approximately 0.05). In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense).

In some embodiments, an electroactive element may include an elastomer material, which may have a Poisson's ratio of approximately 0.35 or less. In some embodiments, an electroactive element (e.g., a nanovoided polymer element) may have a thickness (such as a layer thickness) of approximately 10 nm to approximately 10 µm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 µm, approximately 2 µm, approximately 3 µm, approximately 4 µm, approximately 5 µm, approximately 6 µm, approximately 7 µm, approximately 8 µm, approximately 9 µm, approximately 10 µm), with an example thickness of approximately 200 nm to approximately 1 µm.

An electroactive device may include a multilayer, such as a plurality of stacked layers. In some examples, each layer may include an electroactive element disposed between a pair of electrodes. In some examples, an electrode may be shared between layers; for example, a device may have alternating electrodes and electroactive elements located between neighboring pairs of electrodes. Various stacked configurations can be constructed in different geometries that alter the shape, alignment, and spacing between layers. Such complex arrangements can enable compression, extension, twisting, and/or bending when operating the electroactive device.

An electroactive element may include one or more electroactive polymers and may also include additional components. As used herein, "electroactive polymers" may (in some examples) refer to polymers that exhibit a change in size or shape when stimulated by an electric field. Some electroactive polymers may find limited applications due to a low breakdown voltage of the polymers with respect to the operating voltage used by electroactive devices (e.g., actuators) that use the polymers. Electroactive devices with reduced operating voltages and higher energy densities may be useful for many applications.

In some embodiments, an electroactive polymer may include a deformable polymer that may be symmetric with regard to electrical charge (e.g., polydimethylsiloxane (PDMS), acrylates, etc.) or asymmetric (e.g., poled polyvinylidene fluoride (PVDF) or its copolymers such as poly (vinylidenefluoride-co-trifluoroethylene) (PVDF-TrFE)). Additional examples of polymer materials forming electroactive polymer materials may include, without limitation, styrenes, polyesters, polycarbonates, epoxies, halogenated polymers, such as PVDF, copolymers of PVDF, such as PVDF-TrFE, silicone polymers, and/or any other suitable polymer materials. Such materials may have any suitable dielectric constant or relative permittivity, such as, for example, a dielectric constant ranging from approximately 2 to approximately 30.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

In some embodiments, the electroactive elements described herein may include voids, such as nanovoids (e.g., having a plurality of voids and/or nanoscale-sized voids in an electroactive element including an electroactive polymer or composite thereof). In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the electroactive elements. The voids and/or nanovoids may be either closed- or open-celled, or a mixture thereof. If they are open-celled, the void size may be the minimum average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, and/or approximately 1000 nm).

In some embodiments, the term "effective density," as used herein, may refer to a parameter that may be obtained using a test method where a uniformly thick layer of the elastomer may be placed between two flat and rigid circular plates. In some embodiments, the diameter of the elastomer material being compressed may be at least 100 times the thickness of the elastomer material. The diameter of the elastomer material may be measured, then the plates may be pressed together to exert a pressure of at least approximately $1 \times 10^6$ Pa on the elastomer, and the diameter of the elastomer is remeasured. The effective density may be determined from an expression DR=($D_{uncompressed}/D_{compressed}$), where DR may represent the effective density ratio, $D_{uncompressed}$ may represent the density of the uncompressed polymer, and $D_{compressed}$ may represent the density of the compressed polymer.

The density of voids within an electroactive element, or other dielectric material, may vary as a function of position. In some embodiments, the volume fraction of an electroactive component (or dielectric material) may vary between 10% and 70%. The structure of the voids may be interconnected (open cell) or the voids may be fully enclosed by suitable dielectric material (closed cell). The voids may be partially filled with a dielectric liquid or dielectric gas. The voids may be partially coated with a layer of suitable material. In some embodiments, a voided material (such as a porous material) may be fabricated using a templating agent, such as a material that directs the structural formation of pores or other structural elements of an electroactive element. A templating agent may be any phase of matter (solid, liquid, gas). In some embodiments, a templating agent is removed to produce a pore (or void).

In some embodiments, the electroactive elements described herein may include particles including a material having a high dielectric constant, with the particles having an average diameter between approximately 10 nm and approximately 1000 nm. In some embodiments, the material having the high dielectric constant may include barium titanate.

In some embodiments, an electroactive element may include one or more polymers, and may additionally include a plurality of particles. In some embodiments, an electroactive element may include particles of a material to assist the formation of voids, support voided regions, or both. Example particle materials include: a silicate, such as silica, including structures resulting from silica gels, fumed silica; a titanate, such as barium titanate; a metal oxide, such as a transition metal oxide, such as titanium dioxide; another oxide; composites or combinations thereof; or other particle material. The particles may have an average diameter between approximately 10 nm and approximately 1000 nm, and the particles may form branched or networked particles with average dimensions of between approximately 100 and approximately 10,000 nm.

In some embodiments, an electroactive element may include particles of a material having a high dielectric constant. In some embodiments, the particles may have an average diameter between approximately 10 nm and approximately 1000 nm. In some embodiments, the particle material may have a high dielectric constant. In some embodiments, the particle material may include a titanate, such as barium titanate ($BaTiO_3$), or other perovskite material such as other titanates.

Additionally or alternatively, any other suitable component may be added to the electroactive polymer material. For example, a ferroelectric material such as a titanate, for example, $BaTiO_3$ may be added. $BaTiO_3$ is a ferroelectric material with a relatively high dielectric constant (e.g., a value of between approximately 500 and approximately 7000) and polarization and may be used in various electroactive devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive element or the second electroactive element.

In some embodiments, an electroactive device includes a first electrode, a second electrode and a voided polymer layer interposed between at least a portion of the area of the first and second electrode. In some embodiments, the voided polymer layer has no periodic structure on length scales greater than 10 nm and the voids have a characteristic length scale that is less than 1 micron. Voids may form a connected structure in an open cell configuration, or the voids may be surrounded, for example, by dielectric material in a closed cell configuration. In some embodiments, a voided dielectric material may further include particles of a material with a high dielectric constant, such as a solid such as barium titanite. In some embodiments, voids may be filled with a fluid, such as a liquid or a gas, for example, a dielectric liquid or a dielectric gas with high dielectric strength gas, such as a halide, in particular a fluoride such as is sulfur hexafluoride, organofluoride or the like.

In some embodiments, an "electrode," as used herein, may refer to a conductive material, which may be in the form of a film or a layer. The electrode may be self-healing, such that when an area of an active layer (e.g., an electroactive element) shorts out, the electrode may be able to isolate the damaged area.

In some embodiments, the electrodes (e.g., such as a first electrode, a second electrode, or any other electrode) may include a metal such as aluminum, gold, silver, tin, copper, indium, gallium, zinc, and the like. An electrode may include one or more electrically conductive materials, such as a metal, a semiconductor (such as a doped semiconductor), carbon nanotube, graphene, transparent conductive oxides (TCOs, e.g., indium tin oxide (ITO), zinc oxide (ZnO), etc.), or other electrically conducting material.

In some embodiments, electroactive devices may include paired electrodes, which allow the creation of the electrostatic field that forces constriction of the electroactive polymer. Such electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials formed by vacuum deposition, spray, adhesion, and/or any other suitable technique either on a non-electroactive polymer layer or directly on the electroactive polymer surface itself. In some embodiments, the electrode or electrode layer may be self-healing, such that damage from local shorting of a circuit can be isolated. Suitable self-healing electrodes may include thin films of metals, such as, for example, aluminum.

In some embodiments, one or more electrodes may be optionally electrically interconnected, for example, through a contact layer, to a common electrode. In some embodiments, an electroactive device may have a first common electrode, connected to a first plurality of electrodes, and a second common electrode, in some examples connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer. In some embodiments, an electrode (or other electrical connector) may include a metal (e.g., tin, aluminum, copper, gold, silver, and the like). In some embodiments, an electrode (such as an electrical contact) or an electrical connector may include a similar material to other similar components.

In some embodiments, a first electrode may overlap (e.g., overlap in a parallel direction) at least a portion of a second electrode. The first and second electrode may be generally parallel and spaced apart. A third electrode may overlap at least a portion of either the first or second electrode. An electroactive element may include a first polymer (e.g., an elastomer material) and may be disposed between a first pair of electrodes (e.g., the first electrode and the second electrode). A second electroactive element, if used, may include a second elastomer material and may be disposed between second a pair of electrodes. In some embodiments, there may be an electrode that is common to both the first pair of electrodes and the second pair of electrodes.

In some embodiments, a common electrode may be electrically coupled (e.g., electrically contacted at an interface having a low contact resistance) to one or more other electrode(s), for example, a second electrode and a third electrode located either side of a first electrode. In some embodiments, an electroactive device may include additional electroactive elements interleaved between electrodes, for example, in a stacked configuration. For example, electrodes may form an interdigitated stack of electrodes, with alternate electrodes connected to a first common electrode and the remaining alternate electrodes connected to a second common electrode. For example, an additional electroactive element may be disposed on the other side of a first electrode. The additional electroactive element may overlap a first electroactive element. An additional electrode may be disposed abutting a surface of any additional electroactive element. In some embodiments, an electroactive device may include more (e.g., two, three, or more) such additional electroactive elements and corresponding electrodes. For example, an electroactive device may include a stack of two or more electroactive elements and corresponding electrodes. For example, an electroactive device may include between 2 electroactive elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive elements.

In some embodiments, electrodes may be flexible and/or resilient and may stretch, for example, elastically, when an electroactive element undergoes deformation. Electrodes may include one or more transparent conducting oxides (TCOs) such as indium oxide, tin oxide, indium tin oxide (ITO) and the like, graphene, carbon nanotubes, and the like. In other embodiments, for example, embodiments where electroactive devices have electroactive elements including nanovoided electroactive polymer materials, relatively rigid electrodes (e.g., electrodes including a metal such as aluminum) may be used.

In some embodiments, an electrode (e.g., the first and/or second electrode, or any other electrode) may have an electrode thickness of approximately 1 nm to approximately 100 nm, with an example thickness of approximately 10 nm to approximately 50 nm. In some embodiments, an electrode may be designed to allow healing of electrical breakdown (e.g., the electric breakdown of elastomeric polymer materials) of an electroactive element. In some embodiments, an electrode may have an electrode thickness of approximately 20 nm. In some embodiments, a common electrode may have a sloped shape, or may be a more complex shape (e.g., patterned or freeform). In some embodiments, a common electrode may be shaped to allow compression and expansion of an electroactive device during operation.

In some embodiments, the electrodes described herein (e.g., the first electrode, the second electrode, or any other electrode including any common electrode) may be fabricated using any suitable process. For example, electrodes may be fabricated using physical vapor deposition (PVD), chemical vapor deposition (CVD), sputtering, spray-coating, spin-coating, atomic layer deposition (ALD), and the like. In some embodiments, an electrode may be manufactured using a thermal evaporator, a sputtering system, a spray coater, a spin-coater, an ALD unit, and the like. In some embodiments, an electroactive element may be deposited directly on to an electrode. In some embodiments, an electrode may be deposited directly on to the electroactive element. In some embodiments, electrodes may be prefabricated and attached to an electroactive element. In some embodiments, an electrode may be deposited on a substrate, for example, a glass substrate or flexible polymer film. In some embodiments, an electroactive element may directly abut an electrode. In some embodiments, there may be a dielectric layer, such as an insulating layer, between an electroactive element and an electrode. Any suitable combination of processes may be used.

In some embodiments, the electroactive devices described herein may include or be mechanically coupled to one or more optical elements. An optical element may include a lens, mirror, prism, holographic element, beam splitter, optical filter, diffraction grating, or other optical element. In some embodiments, an electroactive device, such as an actuator, may include or be mechanically coupled to an adjustable lens. An adjustable lens may include any suitable type of lens with adjustable optical properties (e.g., adjustable optical power/focal length, correcting for wave-front distortion and/or aberrations, etc.), a liquid lens, a gel lens, or other adjustable lens. For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and elastic material. For example, a deformable optical element may include a natural or synthetic elastomer that returns to a resting state when a deforming force is removed. In some embodiments, a deformable optical element may be deformed using an electroactive device generating a directly-driven force to produce a desired optical power or other optical property, for example, for a lens or other optical element. In some embodiments, actuation forces may be applied around a perimeter of a deformable lens and may be generally uniform or variable around the perimeter of a lens. In some embodiments, electroactive devices may be used to actuate deformable optical elements in optical assemblies (e.g., lens systems).

In some embodiments, an actuator may include a bender. In some embodiments, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material multilayer (e.g., including stacked layers) operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some embodiments, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

In some embodiments, an electroactive device may include one or more direct-drive benders, that may include an electroactive element that is disposed between two electrodes. In such examples, methods of forming an electroactive device may involve forming electrodes and an electroactive polymer simultaneously (e.g., via coflowing, slot die coating, etc.).

In some embodiment, a lens assembly may include multiple deformable optical elements (e.g., multiple deformable lenses, such as liquid lenses), where the deformation is provided by one or more electroactive devices, in accordance with example embodiments of the disclosure.

Various fabrication methods are discussed herein. Properties of the electroactive element may be varied across its spatial extent by varying one or more process parameters, such as wavelength, intensity, substrate temperature, other process temperature, gas pressure, application of additional radiation, chemical concentration gradients, chemical composition variations (e.g., to control micelle size), or other process parameter. Non-uniform void size distributions may be obtained by varying the size of sacrificial regions within an electroactive element.

Methods of forming an electroactive device include forming electrodes and electroactive elements sequentially (e.g., via vapor deposition, coating, printing, etc.) or simultaneously (e.g., via co-flowing, coextrusion, slot die coating, etc.). Alternatively, the electroactive elements may be deposited using initiated chemical vapor deposition (iCVD), where, for example, suitable monomers of the desired polymers may be used to form the desired coating. In some embodiments, monomers, oligomers, and/or prepolymers for forming the electroactive elements may optionally be mixed with a solvent and the solvent may be removed from the electroactive element during and/or following curing to form nanovoids within the electroactive element.

A method of fabricating an electroactive device may include depositing a polymerizable material onto a first electrode, curing the deposited polymerizable material to form an electroactive element (e.g., including a cured elastomer material) and depositing an electrically conductive material onto a surface of the electroactive element opposite the first electrode to form a second electrode. In some embodiments, the cured elastomer material may have a Poisson's ratio of approximately 0.35 or less. In some embodiments, a method may further include depositing an additional polymerizable material onto a surface of the second electrode opposite the electroactive element, curing the deposited additional polymerizable material to form a second electroactive element including a second cured elastomer material, and depositing an additional electrically conductive material onto a surface of the second electroactive element opposite the second electrode to form a third electrode.

In some embodiments, a method of fabricating an electroactive element may include vaporizing a polymerizable material, or a precursor thereof, where depositing the polymerizable material may include depositing the vaporized polymerizable material onto the first electrode. In some embodiments, a method of fabricating an electroactive element may include printing the polymer or precursor thereof (such as a curable material) onto an electrode. In some embodiments, a method may also include combining a polymerizable material (such as a polymer precursor material, such as a monomer) with at least one other component to form a precursor composition for deposition. In some embodiments, a method may include combining a polymerizable material with particles of a material having a high dielectric constant to form a deposition mixture.

According to some embodiments, a method may include positioning a polymerizable material between a first electrically conductive material and a second electrically conductive material. The positioned polymerizable material may be cured to form an electroactive element including a cured elastomer material. In some embodiments, the cured elastomer material may have a Poisson's ratio of approximately 0.35 or less. In some embodiments, at least one of the first electrically conductive material or the second electrically conductive material may include a curable electrically conductive material, and the method may further include curing the at least one of the first electrically conductive material or the second electrically conductive material to form an electrode. In this example, curing the at least one of the first electrically conductive material or the second electrically conductive material may include curing the at least one of the first electrically conductive material or the second electrically conductive material during curing of the positioned polymerizable material.

In some embodiments, a polymerizable material and at least one of a first electrically conductive material or a second electrically conductive material may be flowable during positioning of the polymerizable material between the first and second electrodes. A method of fabricating an electroactive device may further include flowing a polymerizable material and at least one of the first electrically conductive material or the second electrically conductive material simultaneously onto a substrate.

In some embodiments, methods for fabricating an electroactive device (e.g., an actuator) may include masks (e.g., shadow masks) to control the patterns of deposited materials to form the electroactive device. In some embodiments, the electroactive device may be fabricated on a surface enclosed by a deposition chamber, which may be evacuated (e.g., using one or more mechanical vacuum pumps to a predetermined level such as 10-6 Torr or below). A deposition chamber may include a rigid material (e.g., steel, aluminum, brass, glass, acrylic, and the like). A surface used for deposition may include a rotating drum. In some embodiments, the rotation may generate centrifugal energy and cause the deposited material to spread more uniformly over any underlying sequentially deposited materials (e.g., electrodes, polymer elements, and the like) that are mechanically coupled to the surface. In some embodiments, the surface may be fixed and the deposition and curing systems may move relative to the surface, or both the surface, the deposition, and/or curing systems may be moving simultaneously.

In some embodiments, an electroactive device (e.g., an actuator, sensor, or the like) may be fabricated by providing an electrically conductive layer (e.g., a first electrode) having a first surface, depositing (e.g., vapor depositing) a polymer (e.g., an electroactive polymer) or polymerizable material (such as a polymer precursor, such as a monomer) onto the electrode, as needed, forming a polymer such as an electroactive polymer from the polymerizable material (e.g., by curing or a similar process), and depositing another electrically conductive layer (e.g., a second electrode) onto the electroactive polymer. In some embodiments, the method may further include repeating one or more of the above to fabricate additional layers (e.g., second electroactive element, other electrodes, alternating stack of polymer layers and electrodes, and the like. An electroactive device may have a stacked configuration.

In some embodiments, an electroactive device may be fabricated by first depositing a first electrode, and then depositing a polymerizable material (e.g., a monomer) on the first electrode (e.g., deposited using a vapor deposition process). In some embodiments, an inlet (not shown) to a deposition chamber may open and may input an appropriate monomer initiator for starting a chemical reaction. In some embodiments, "monomer," as used herein, may refer to a monomer that forms a given polymer (i.e., as part of an electroactive element). In other examples, polymerization of a polymerizable material (such as polymer precursor, e.g., a monomer) may include exposure to electromagnetic radiation (e.g., visible, UV, x-ray or gamma radiation), exposure to other radiation (e.g., electron beams, ultrasound), heat, exposure to a chemical species (such as a catalyst, initiator, and the like, some combination thereof, and the like.

Deposited polymerizable material may be cured with a source of radiation (e.g., electromagnetic radiation, such as UV and/or visible light) to form an electroactive element that includes a cured elastomer material, for example, by photopolymerization. In some embodiments, a radiation source may include an energized array of filaments that may generate electromagnetic radiation, a semiconductor device such as light-emitting diode (LED) or semiconductor laser, other laser, fluorescence or an optical harmonic generation source, and the like. A monomer and an initiator (if used) may react upon exposure to radiation to form an electroactive element. In some embodiments, radiation may include radiation having an energy (e.g., intensity and/or photon energy) capable of breaking covalent bonds in a material. Radiation examples may include electrons, electron beams, ions (such as protons, nuclei, and ionized atoms), x-rays, gamma rays, ultraviolet visible light, or other radiation, for example, having appropriately high energy levels. In some embodiments, the cured elastomer material may include at least one non-polymeric component in a plurality of defined regions and the method may further include removing at least a portion of the at least one non-polymeric component from the cured elastomer material to form a voided (e.g., nanovoided) polymer element.

An electrically conductive material may then be deposited onto a surface of the first electroactive element opposite a first electrode to form a second electrode. An additional polymerizable material may be deposited onto a surface of the second electrode opposite the electroactive element. For example, the deposited additional polymerizable material may be cured to form a second electroactive element, for example, including a second cured elastomer material. In some embodiments, an additional electrically conductive material may be deposited onto a surface of the second electroactive element opposite the second electrode to form a third electrode.

In some embodiments, a deposition chamber may have an exhaust port configured to open to release at least a portion of the vapor in the chamber during and/or between one or more depositions of the materials (e.g., monomers, oligomers, monomer initiators, conductive materials, etc.). In some embodiments, a deposition chamber may be purged (e.g., with a gas or the application of a vacuum, or both) to remove a portion of the vapor (e.g., monomers, oligomers, monomer initiators, metal particles, and any resultant by-products). Thereafter, one or more of the previous steps may be repeated (e.g., for a second electroactive element, and the like). In this way, individual layers of an electroactive device may be maintained at high purity levels.

In some embodiments, the deposition of the materials (e.g., monomers, oligomers, monomer initiators, conductive materials, etc.) of the electroactive device may be performed using a deposition process, such as chemical vapor deposition (CVD), to be described further below. CVD may refer to a vacuum deposition method used to produce high-quality, high-performance, solid materials. In CVD, a substrate may be exposed to one or more precursors, which may react and/or decompose on the substrate surface to produce the desired deposit (e.g., one or more electrodes, electroactive polymers, etc.). Frequently, volatile by-products are also produced, which may be removed by gas flow through the chamber.

In some embodiments, an electroactive device may be fabricated using an atmospheric pressure CVD (APCVD) coating formation technique (e.g., CVD at atmospheric pressure). In some embodiments, an electroactive device may be fabricated using a low-pressure CVD (LPCVD) process (e.g., CVD at sub-atmospheric pressures). In some embodiments, LPCVD may make use of reduced pressures that may reduce unwanted gas-phase reactions and improve the deposited material's uniformity across the substrate. In one aspect, a fabrication apparatus may apply an ultrahigh vacuum CVD (UHVCVD) process (e.g., CVD at very low pressure, typically below approximately $10^{-6}$ Pa (equivalently, approximately $10^{-8}$ torr)).

In some embodiments, an electroactive device may be fabricated using an aerosol assisted CVD (AACVD) process (e.g., a CVD in which the precursors are transported to the electroactive device) by means of a liquid/gas aerosol, which may be generated ultrasonically or with electrospray. In some embodiments, AACVD may be used with non-volatile precursors. In some embodiments, an electroactive device may be fabricated using a direct liquid injection CVD (DLICVD) process (e.g., a CVD in which the precursors are in liquid form, for example, a liquid or solid dissolved in a solvent). Liquid solutions may be injected in a deposition chamber towards one or more injectors. The precursor vapors may then be transported to the electroactive device as in CVD. DLICVD may be used on liquid or solid precursors, and high growth rates for the deposited materials may be reached using this technique.

In some embodiments, an electroactive device may be fabricated using a hot wall CVD process (e.g., CVD in which the deposition chamber is heated by an external power source and the electroactive device is heated by radiation from the heated wall of the deposition chamber). In another aspect, an electroactive device may be fabricated using a cold wall CVD process (e.g., a CVD in which only the electroactive device is directly heated, for example, by induction, while the walls of the chamber are maintained at room temperature).

In some embodiments, an electroactive device may be fabricated using a microwave plasma-assisted CVD (MPCVD) process, where microwaves are used to enhance chemical reaction rates of the precursors. In another aspect, an electroactive device may be fabricated using a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the electroactive device or in depositing certain materials (e.g., organic materials and/or some polymers).

In some embodiments, an electroactive device may be fabricated using a remote plasma-enhanced CVD (RPECVD) process. In some embodiments, RPECVD may be similar to PECVD except that the electroactive device may not be directly in the plasma discharge region. In some embodiments, the removal of the electroactive device from the plasma region may allow for the reduction of processing temperatures down to room temperature.

In some embodiments, an electroactive device may be fabricated using an atomic-layer CVD (ALCVD) process. In some embodiments, ALCVD may deposit successive layers of different substances to produce layered, crystalline film coatings on the electroactive device.

In some embodiments, an electroactive device may be fabricated using a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (monolayer) to several micrometers in thickness) and nanomaterials, which may be used in forming the electroactive device.

In some embodiments, an electroactive device may be fabricated using a hot filament CVD (HFCVD) process, which may also be referred to as catalytic CVD (cat-CVD) or initiated CVD (iCVD). In some embodiments, this process may use a hot filament to chemically decompose the source gases to form the materials of the electroactive device. Moreover, the filament temperature and temperature of portions of the electroactive device may be independently controlled, allowing colder temperatures for better adsorption rates at the electroactive device, and higher temperatures necessary for decomposition of precursors to free radicals at the filament.

In some embodiments, an electroactive device may be fabricated using a hybrid physical-chemical vapor deposition (HPCVD) process. HPCVD may involve both chemical decomposition of precursor gas and vaporization of a solid source to form the materials on the electroactive device.

In some embodiments, an electroactive device may be fabricated using metalorganic chemical vapor deposition (MOCVD) process (e.g., a CVD that uses metalorganic precursors) to form materials on the electroactive device. For example, an electrode may be formed on an electroactive element using this approach.

In some embodiments, an electroactive device may be fabricated using a rapid thermal CVD (RTCVD) process. This CVD process uses heating lamps or other methods to rapidly heat the electroactive device. Heating only the electroactive device rather than the precursors or chamber walls may reduce unwanted gas-phase reactions that may lead to particle formation in the electroactive device.

In some embodiments, an electroactive device may be fabricated using a photo-initiated CVD (PICVD) process. This process may use UV light to stimulate chemical reactions in the precursor materials used to make the materials for the electroactive device. Under certain conditions, PICVD may be operated at or near atmospheric pressure.

In some embodiments, electroactive devices may be fabricated by a process including depositing a polymerizable material (e.g., a monomer such as an acrylate or a silicone) and a solvent for the polymerizable material onto a substrate, heating the polymerizable material with at least a portion of the solvent remaining with the cured monomer, and removing the solvent from the cured monomer. Using this process, voids such as nanovoids may be formed in the electroactive element. In some embodiments, a flowable material (e.g., a solvent) may be combined with the polymerizable materials (e.g., monomers and conductive materials) to create a flowable mixture that may be used for producing electroactive polymers with nanovoids. The monomers may be monofunctional or multifunctional, or mixtures thereof. Multifunctional monomers may be used as crosslinking agents to add rigidity or to form elastomers. Multifunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different polymerizing mechanisms.

In some embodiments, the flowable material may be combined (e.g., mixed) with a polymerizable material (e.g., a monomer). In some embodiments, a polymerizable material may be combined with at least one non-curable component (e.g., particles of a material having a high dielectric constant) to form a mixture including the polymerizable material and the at least one non-curable component, for example, on an electrode (e.g., a first electrode or a second electrode) of the electroactive device. Alternatively, the flowable material (e.g., solvent) may be introduced into a vaporizer to deposit (e.g., via vaporization or, in alternative embodiments, via printing) a polymerizable material onto an electrode. In some embodiments, a flowable material (e.g., solvent) may be deposited as a separate layer either on top or below a polymerizable material (e.g., a monomer) and the solvent and polymerizable material may be allowed to diffuse into each other before being cured by the source of radiation to generate an electroactive polymer having nanovoids. In some embodiments, after the polymerizable material is cured, the solvent may be allowed to evaporate before another electroactive polymer or another electrode is formed. In some embodiments, the evaporation of the solvent may be accelerated by the application of heat to the surface with a heater, which may, for example, by disposed within a drum forming surface and/or any other suitable location, or by reducing the pressure of the solvent above the substrate using a cold trap (e.g., a device that condenses vapors into a liquid or solid), or a combination thereof. Isolators (not shown) may be added to the apparatus to prevent, for example, the solvent vapor from interfering with the radiation source or the electrode source.

In some embodiments, the solvent may have a vapor pressure that is similar to at least one of the monomers being evaporated. The solvent may dissolve both the monomer and the generated electroactive polymer, or the solvent may dissolve only the monomer. Alternatively, the solvent may have low solubility for the monomer, or plurality of monomers if there is a mixture of monomers being applied. Furthermore, the solvent may be immiscible with at least one of the monomers and may at least partially phase separate when condensed on the substrate.

In some embodiments, there may be multiple vaporizers, with each of the multiple vaporizers applying a different material, including solvents, non-solvents, monomers, and/or ceramic precursors such as tetraethyl orthosilicate and water, and optionally a catalyst for forming a sol-gel such as HCl or ammonia.

In some embodiments, a method of generating a nanovoided polymer for use in connection with an electroactive device (such as electroactive devices described variously herein) may include co-depositing a monomer or mixture of monomers, a surfactant, and a nonsolvent material associated with the monomer(s) which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other polymerization agents (such as curing agents) may be used. For example, polyamines, higher fatty acids or their esters, and/or sulfur-containing compounds may be used as the monomer(s).

In some aspects, the surfactant may be ionic or non-ionic. In another aspect, the non-solvent material may include organic and/or inorganic non-solvent materials. For instance, the non-solvent material may include water or a hydrocarbon or may include a highly polar organic compound such as ethylene glycol. As noted, the monomer or monomers, non-solvent, and surfactant may be co-deposited. Alternatively, the monomer or monomers, non-solvent, and/or surfactant may be deposited sequentially. In one aspect, a substrate temperature may be controlled to generate and control one or more properties of the resulting emulsion generated by co-depositing or sequentially depositing the monomer or monomers, non-solvent, and surfactant. The substrate may be treated to prevent destabilization of the emulsion. For example, an aluminum layer may be coated with a thin polymer layer made by depositing a monomer followed by curing the monomer.

As discussed throughout the instant disclosure, the disclosed devices, systems, and methods may provide one or more advantages over conventional devices, systems, and methods. For example, in contrast to prior devices, the electroactive devices presented herein may include electroactive elements that achieve substantially uniform strain in the presence of an electrostatic field produced by a potential difference between paired electrodes, permitting the electroactive devices to achieve, for example, improvements in both energy density and specific power density. Such uniform strain may reduce or eliminate unwanted deformations in the electroactive elements and may result in greater overall deformation, such as compression, of the electroactive elements, providing a greater degree of movement of surface regions of the electroactive elements while requiring a lower amount of energy to provide such deformation. The electroactive elements may include polymer materials having nanovoided regions that allow for additional compression in the presence of a voltage gradient in comparison to non-voided materials. Additionally, an electroactive device may be formed in a stacked structure having a plurality of electroactive elements that are layered with multiple electrodes, enabling the plurality of electroactive elements to be actuated in conjunction with each other in a single device that may undergo a more substantial degree of deformation (e.g., compression and/or expansion) in comparison to an electroactive device having a single electroactive element or layer.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor apparatuses.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

What is claimed is:

1. A method, comprising:
   depositing a precursor layer onto a substrate, the precursor layer including droplets comprising a polymerizable material;
   inducing a phase inversion in the precursor layer to obtain a modified precursor layer including droplets of a non-polymerizable liquid within a polymerizable liquid mixture comprising the polymerizable material; and
   polymerizing the polymerizable liquid mixture to obtain a nanovoided polymer element,
   wherein the nanovoided polymer element comprises an electroactive polymer, and
   the substrate comprises a first electrode, the method further comprising forming a second electrode on the nanovoided polymer element so that nanovoided polymer element is located at least in part between the first electrode and the second electrode.

2. The method of claim 1, wherein application of a potential difference between the first electrode and the second electrode induces an electroactive response in the nanovoided polymer element.

3. The method of claim 1, wherein the polymerizable liquid mixture comprises at least one polymerizable species, wherein the at least one polymerizable species comprises a monomer or an oligomer.

4. The method of claim 3, wherein the at least one polymerizable species comprises at least one of an acrylate, an ether, an amide, an acrylamide, an amine, a vinyl, an epoxy, a siloxane, or an isocyanate.

5. The method of claim 1, wherein polymerizing the polymerizable liquid mixture to obtain the nanovoided polymer element comprises irradiation of the polymerizable liquid mixture with UV or visible electromagnetic radiation.

6. The method of claim 1, further comprising fabricating an electroactive device comprising the nanovoided polymer element, wherein the electroactive device is an actuator or a sensor.

7. The method of claim 1, wherein depositing the precursor layer onto the substrate comprises a deposition process, wherein the deposition process comprises one or more of evaporation, spin coating, inkjet printing, non-inkjet printing, vapor deposition, vapor coating, thermal spraying, lamination, mist deposition, extrusion, or transfer of a separately formed material film.

8. The method of claim 1, wherein inducing a phase inversion in the precursor layer comprises modifying a chemical composition of the precursor layer.

9. The method of claim 1, wherein inducing a phase inversion in the precursor layer comprises modifying a temperature of the precursor layer.

10. The method of claim 1, further comprising removing at least a portion of the non-polymerizable liquid from the nanovoided polymer element.

11. The method of claim 10, wherein removing at least a portion of the non-polymerizable liquid from the nanovoided polymer element comprises using a reduced pressure, an increased temperature, or both.

12. A method, comprising:
depositing a precursor layer onto a substrate, the precursor layer comprising droplets comprising a polymerizable material;
inducing a phase inversion in the precursor layer to obtain a modified precursor layer comprising droplets of a non-polymerizable liquid within a liquid mixture comprising the polymerizable material;
polymerizing the liquid mixture to obtain a nanovoided polymer element; and
depositing a pair of electrodes on the nanovoided polymer element, so that at least a portion of the nanovoided polymer element is located between the pair of electrodes, wherein
the nanovoided polymer element comprises an electroactive polymer,
the nanovoided polymer element comprises a nanovoided polymer layer having a layer thickness of between approximately 10 nm and approximately 1 mm, and
the nanovoided polymer layer comprises a plurality of nanovoids.

13. The method of claim 12, further comprising removing one or more liquids from the nanovoided polymer element after polymerizing the liquid mixture.

14. The method of claim 12, wherein inducing a phase inversion in the precursor layer comprises modifying a chemical composition or a temperature of the precursor layer.

15. The method of claim 12, wherein
the precursor layer has a thickness between approximately 10 nm and approximately 100 microns.

16. A method, comprising:
depositing a first electrode;
depositing a precursor layer onto the first electrode, the precursor layer comprising droplets comprising a polymerizable material, the droplets being located within a non-polymerizable liquid mixture;
inducing a phase inversion in the precursor layer to obtain a phase-inverted precursor layer comprising droplets of a non-polymerizable liquid within a polymerizable liquid mixture;
polymerizing the polymerizable liquid mixture to obtain a nanovoided polymer element; and
depositing a second electrode onto the nanovoided polymer element,
wherein the nanovoided polymer element comprises an electroactive polymer comprising a plurality of nanovoids.

17. The method of claim 16, further comprising removing one or more liquids from the nanovoided polymer element after polymerizing the polymerizable liquid mixture.

18. The method of claim 16, wherein the method is performed by a deposition apparatus.

19. The method of claim 18, wherein depositing the precursor layer is performed by a vaporizer of the deposition apparatus.

* * * * *